(12) United States Patent
Kunioka et al.

(10) Patent No.: US 7,815,456 B2
(45) Date of Patent: Oct. 19, 2010

(54) SEMICONDUCTOR DEVICE SOCKET

(75) Inventors: Shuuji Kunioka, Yokohama (JP);
Katsumi Suzuki, Tokyo (JP); Yuji Kato, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/502,901

(22) Filed: Jul. 14, 2009

(65) Prior Publication Data

US 2010/0159731 A1 Jun. 24, 2010

(30) Foreign Application Priority Data

| Dec. 22, 2008 | (JP) | ............................. 2008-326237 |
| Jun. 10, 2009 | (JP) | ............................. 2009-139389 |

(51) Int. Cl.
*H01R 13/62* (2006.01)

(52) U.S. Cl. ......................................... 439/331; 439/73

(58) Field of Classification Search ................... 439/73, 439/331
See application file for complete search history.

(56) References Cited

U.S. PATENT DOCUMENTS

| 4,515,425 | A | 5/1985 | Nakano |
| 5,518,410 | A | 5/1996 | Masami |
| 6,126,467 | A | 10/2000 | Ohashi |
| 6,155,859 | A | 12/2000 | Choy |
| 6,213,806 | B1 | 4/2001 | Choy |
| 6,293,809 | B1 | 9/2001 | Shimada |
| 6,386,896 | B2 | 5/2002 | Sekiguchi |
| 6,443,741 | B1 | 9/2002 | Watanabe |
| 6,776,641 | B2 * | 8/2004 | Hachuda ..................... 439/331 |
| 6,872,083 | B2 * | 3/2005 | Kanesashi ..................... 439/73 |
| 6,966,783 | B2 | 11/2005 | Hachuda et al. |
| 7,230,830 | B2 * | 6/2007 | Ujike et al. .................. 361/704 |
| 7,559,784 | B2 * | 7/2009 | Hsiao et al. .................. 439/331 |
| 7,666,016 | B2 * | 2/2010 | Kobayashi ................... 439/296 |
| 2009/0291582 | A1 * | 11/2009 | Lin ............................. 439/331 |

FOREIGN PATENT DOCUMENTS

| JP | 59-135699 | 9/1984 |
| JP | 6-37349 | 9/1994 |
| JP | 6-86293 | 12/1994 |
| JP | 7-19983 | 4/1995 |
| JP | 7-120549 | 12/1995 |
| JP | 08-046335 | 2/1996 |
| JP | 10-74571 | 3/1998 |
| JP | 10-256764 | 9/1998 |
| JP | 2822850 | 9/1998 |
| JP | 11-26123 | 1/1999 |
| JP | 11-54670 | 2/1999 |
| JP | 11-251026 | 9/1999 |
| JP | 11-251027 | 9/1999 |
| JP | 2000-171507 | 6/2000 |

(Continued)

*Primary Examiner*—Renee Luebke
*Assistant Examiner*—Larisa Tsukerman
(74) *Attorney, Agent, or Firm*—Finnegan, Henderson, Farabow, Garrett & Dunner LLP

(57) ABSTRACT

A semiconductor device socket including lever members connected to a pressing member movably supported by a pressing member support body. The lever members are operated in conjunction with rotation of an engaging pin of an operating lever supported by a common support shaft with the pressing member support body.

13 Claims, 36 Drawing Sheets

FOREIGN PATENT DOCUMENTS

| | | |
|---|---|---|
| JP | 2000-182739 | 6/2000 |
| JP | 2000-182741 | 6/2000 |
| JP | 2002-202729 | 7/2002 |
| JP | 2003-007942 | 1/2003 |
| JP | 2003-123926 | 4/2003 |
| JP | 2004-014873 | 1/2004 |
| JP | 2004-47163 | 2/2004 |
| JP | 2004-227904 | 8/2004 |
| JP | 2004-296155 | 10/2004 |
| JP | 2005-61948 | 3/2005 |

\* cited by examiner

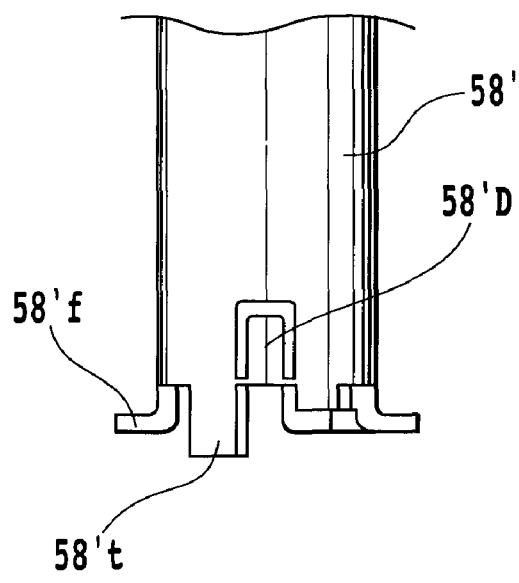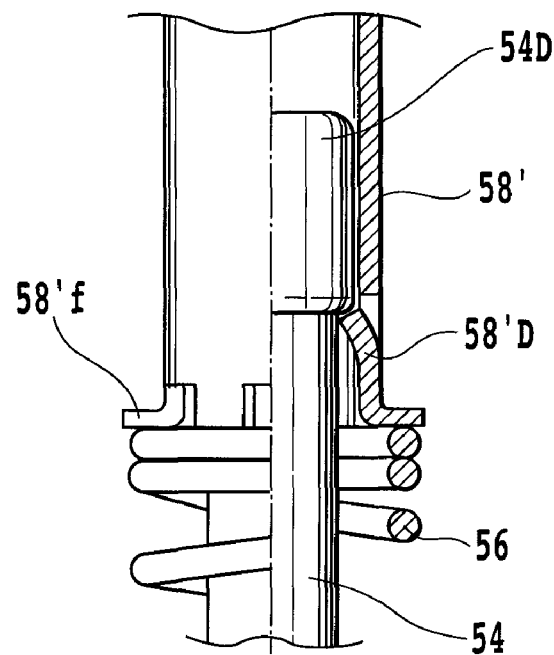
FIG.14A  FIG.14B

SEMICONDUCTOR DEVICE SOCKET

This application claims the benefit of Japanese Patent Application Nos. 2008-326237, filed Dec. 22, 2008, 2009-139389 filed Jun. 10, 2009 which are hereby incorporated by reference herein in their entirety.

BACKGROUND OF THE INVENTION

1. Field of the Invention

The present invention relates to a semiconductor device socket capable of detachably housing a semiconductor device therein.

2. Description of the Related Art

Semiconductor devices to be mounted in electronic equipments are subjected to various tests before being mounted therein, in order to remove latent defects of the devices. The tests are carried out with a semiconductor device being mounted in a semiconductor device socket, for example.

Such a semiconductor device socket used for the tests is generally called an integrated circuit (IC) socket and is arranged on a printed circuit board. The printed circuit board is provided with an input-output portion configured to be supplied with a predetermined test voltage and configured to transmit an anomaly detection signal from the semiconductor device as an object to be tested, the anomaly detection signal representing a short circuit.

As disclosed in Japanese Patent Publication No. 2,822,850, for example, such an IC socket includes: a socket body having a housing section for detachably housing a semiconductor device; multiple contact pins arranged inside the housing section of the socket body and configured to electrically connect respective electrodes of the semiconductor device to electrode sections of the printed circuit board; a main cover rotational movably supported by the socket body and configured to support a press cover and a lever cover to be described below; the press cover having one end movably supported by the main cover and being configured to selectively press the electrodes of the semiconductor device toward respective contact sections of the contact pins; and the lever cover having one end rotational movably supported by the main cover and being configured to press the press cover toward the semiconductor device.

In this configuration, when the semiconductor device is fitted to the housing section of the socket body, the semiconductor device is placed, above the contact pins, in the housing section of the socket body. Then, the main cover is firstly rotated together with the press cover and the lever cover, and is subsequently fixed with respect to the socket body by use of a main cover stopper of the main cover. Next, the lever cover is operated to fix a lever cover stopper thereof with respect to the socket body. This operation moves the press cover downward and thereby causes the press cover to press the electrodes of the semiconductor device to the contact sections of the contact pins against an elastic force of the contact pins. At that time, on the basis of the principle of leverage, an operating force for operating the lever cover should be smaller than a force for pressing the press cover. Therefore, the lever cover can be operated with a smaller force than that needed to press the press cover.

On the other hand, when the semiconductor device is detached from the socket body, the lever cover stopper and the main cover stopper are firstly shifted one by one from a locked state to an unlocked state. Then, the main cover is rotated back to the initial standby position together with the press cover and the lever cover, and then the semiconductor device is detached from the socket body.

SUMMARY OF THE INVENTION

After the above-described operation to press the one end of the lever cover against the elastic force of the contact pins, pressing the one end of the lever cover manually and directly against the elastic force of the contact pins in order to fix the lever cover stopper has a certain limitation along with an increase in the number of the contact pins.

One conceivable option in this case is to make settings to reduce a distance between a fulcrum on the lever cover and a contact point on the press cover, and to increase a length of the lever cover. However, such settings are not recommendable because the size of the socket body is increased and the demand for loading numerous IC sockets on a single printed circuit board at high density is not satisfied.

In view of the above-described problem, the present invention aims to provide a semiconductor device socket capable of detachably housing a semiconductor device therein. The semiconductor device socket can reduce a pressure operating force with respect to the semiconductor device upon mounting the semiconductor device without increasing the size of the IC socket.

To achieve the above-described object, a semiconductor device socket according to the present invention comprises a socket body having a semiconductor device mounting section on which a semiconductor device is detachably arranged and a contact terminal having a contact section to be electrically connected to a terminal of the semiconductor device arranged on the semiconductor device mounting section; a pressing member having a pressing surface configured to press the terminal of the semiconductor device against the contact section of the contact terminal or to release the terminal of the semiconductor device from a pressed state; a pressing member support body having one end rotational movably supported by the socket body and being configured to movably support the pressing surface of the pressing member while keeping the pressing surface substantially parallel to a surface to be pressed of the semiconductor device; a lever member having an intermediate section to be rotational movably supported by the pressing member support body, having one end connected to the pressing member and being configured to move the pressing member with respect to the pressing member support body; and a lever member driving means configured to swing the other end of the lever member.

The semiconductor device socket according to the present invention comprises the lever member having the intermediate section to be rotational movably supported by the pressing member support body, having one end connected to the pressing member and being configured to move the pressing member with respect to the pressing member support body, and the lever member driving means configured to swing the other end of the lever member. According to the semiconductor device socket of the present invention, it is possible to reduce a pressure operating force to be applied to the semiconductor device at the time of fitting of the semiconductor device without causing an increase in size of the IC socket.

Further features of the present invention will become apparent from the following description of exemplary embodiments (with reference to the attached drawings).

BRIEF DESCRIPTION OF THE DRAWINGS

FIGS. 14A and 14B are views showing partially enlarged a modification of the sleeve in the example illustrated in FIG. 8;

DESCRIPTION OF THE EMBODIMENTS

Figure 2:
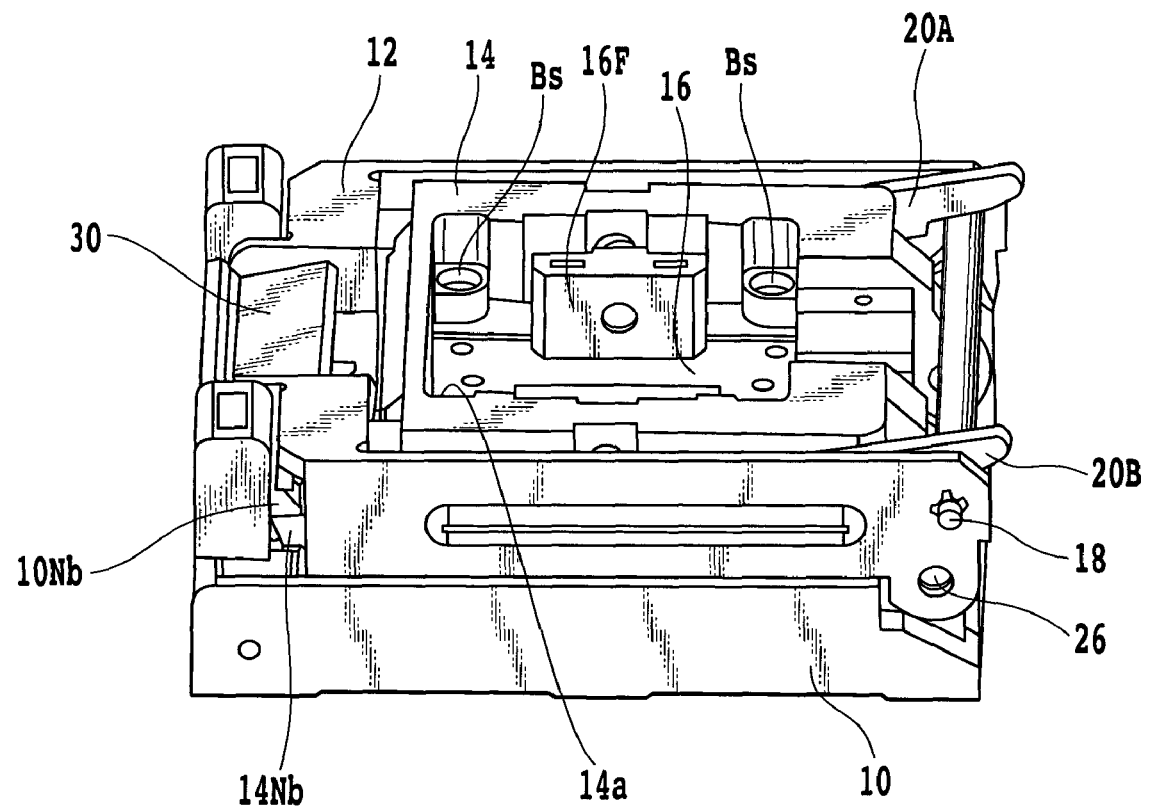
FIG. 2 is a perspective view of the example illustrated in FIG. 1 which shows an operating lever member in a locked state with respect to a socket body.

FIG. 2 shows an appearance of a semiconductor device socket according to a first embodiment of the present invention. It is to be noted that a single semiconductor device socket out of multiple semiconductor device sockets to be arranged on a printed circuit board PB (see FIG. 3) serving as a test board is representatively illustrated in FIG. 2.

In FIG. 2, the semiconductor device socket includes: a socket body 10 having, at its center, a housing section 10A for housing a contact pin module and a positioning member 32 serving as a semiconductor device mounting section as described later; a pressing member support body 14 having one end rotational movably supported by the socket body 10 and being configured to support a pressing member to be described later so as to be movable inward; an operating lever member 12 having one end rotational movably supported by the socket body 10 and being configured to operate lever members 20A and 20B that are rotational movably supported by the pressing member support body 14; and a lock-unlock mechanism configured to lock or unlock the pressing member support body 14 and the operating lever member 12 to the socket body 10.

FIG. 2 shows a state where the pressing member support body 14 and the operating lever member 12 are locked with respect to the socket body 10.

A semiconductor device DV to be detachably placed on the positioning member 32 of the socket body 10 is formed as a substantially square-shaped semiconductor device of a ball grid array (BGA) type, which includes an electrode surface on which multiple ball-shaped electrode sections DVb (see FIG. 13C) are formed in a matrix fashion.

Figure 4:
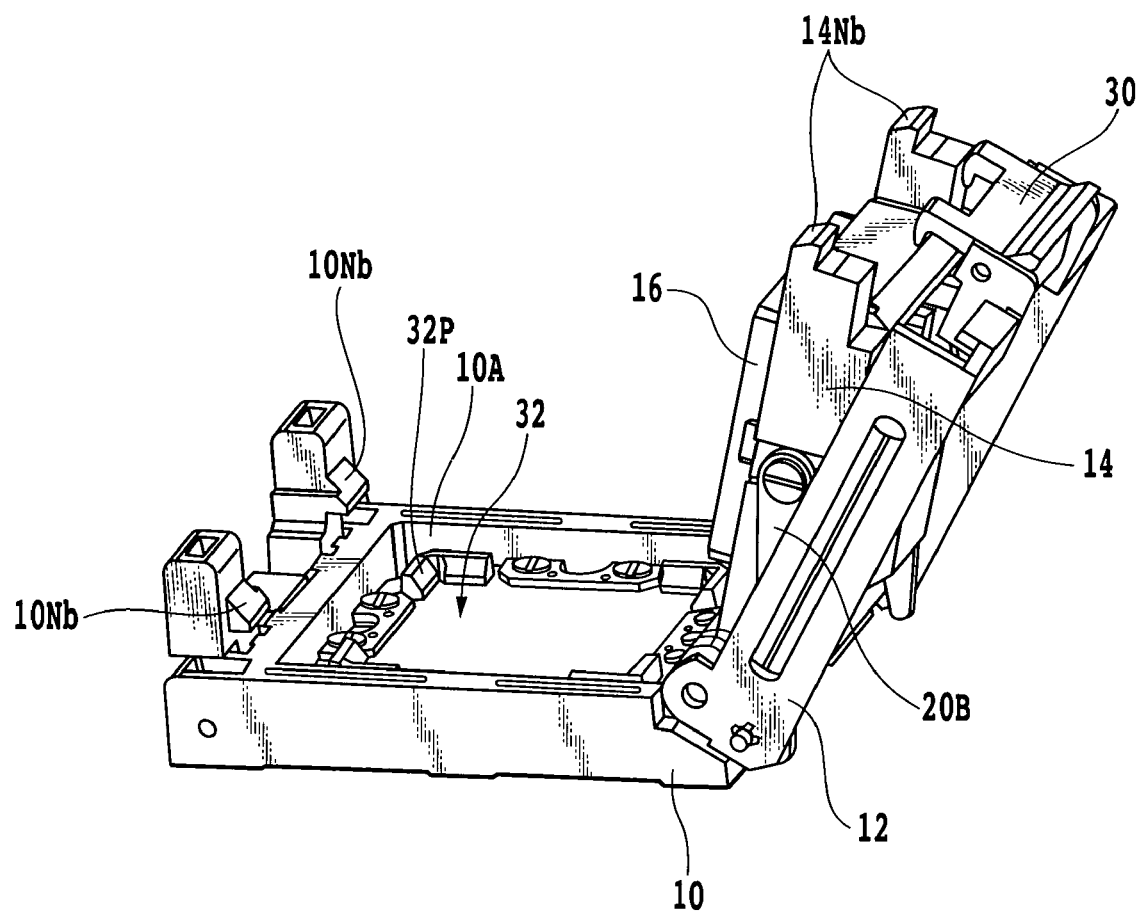
FIG. 4 is a perspective view of the example illustrated in FIG. 1 which shows the operating lever member in an unlocked state with respect to the socket body.
Figure 6:
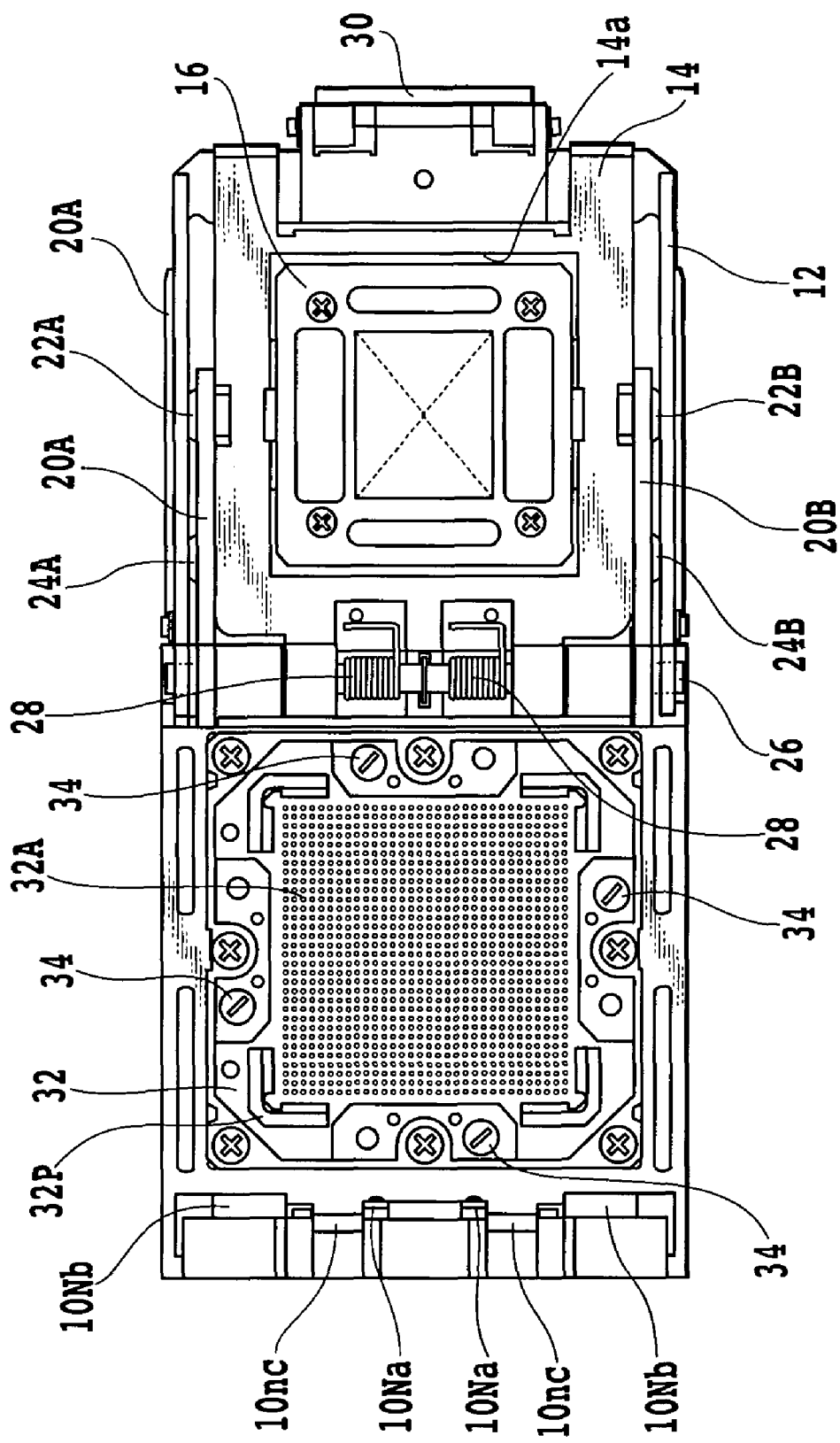
FIG. 6 is a plan view showing the operating lever member and the socket body in the state illustrated in FIG. 4.

As shown in FIGS. 4 and 6, base end portions of the pressing member support body 14 and of the operating lever member 12 are rotational movably supported on one of short sides of the socket body 10 by use of a support shaft 26. The support shaft 26 penetrates into one end side on the periphery of the housing section 10A in the center. In addition, a base end section of a latch member 10LN constituting part of the lock-unlock mechanism to be described later is rotational movably supported on the other short side of the socket body 10 by use of a support shaft 10S. The support shaft 10S penetrates into the other end side on the periphery of the housing section 10A in the center.

Figure 7:
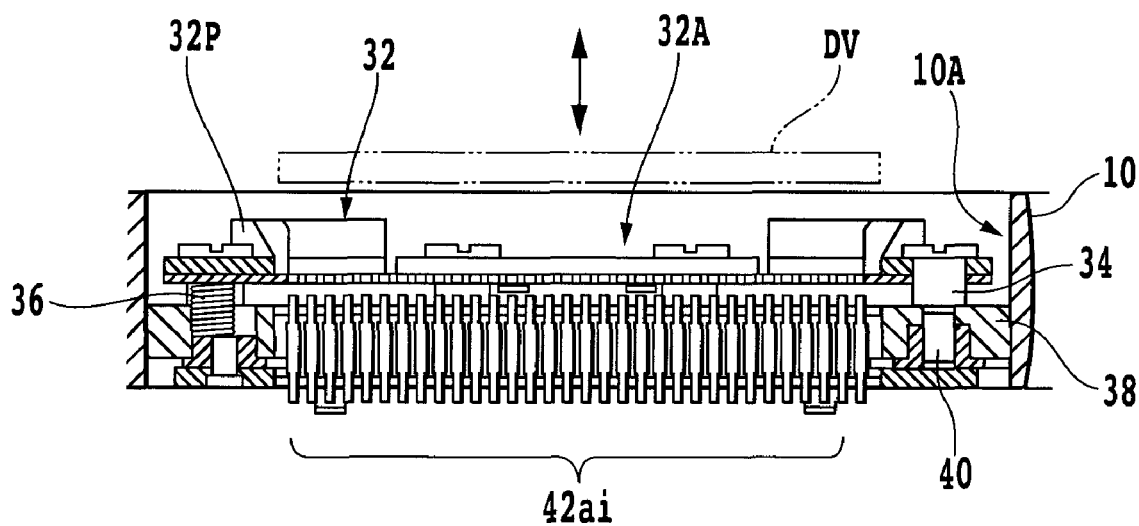
FIG. 7 is a partial cross-sectional view showing a contact pin module in the example illustrated in FIG. 1.

As shown in FIG. 7, the contact pin module and the positioning member 32 are arranged inside the housing section 10A. The positioning member 32 is supported so as to be vertically movable with respect to a substrate 38 to be described later, and includes, at its center, a semiconductor device housing section 32A. Multiple pores are formed in a matrix fashion at a bottom of the semiconductor device housing section 32A so as to correspond to layouts of the electrode sections of the semiconductor device DV and contact pins 42ai. The electrode sections of the semiconductor device DV are arranged at the respective pores at the time of fitting of the semiconductor device DV.

The positioning member 32 is provided with multiple holes into which guide pins are inserted in predetermined positions. One end of each guide pin 34 is fixed to the substrate 38. In addition, coil springs 36 for biasing the positioning member 32 in a direction away from the substrate 38 are provided in multiple positions between the positioning member 32 and the substrate 38. Accordingly, the positioning member 32 is guided by the guide pins 34, and the electrode sections of the semiconductor device DV to be placed on the semiconductor device housing section 32A touch on contact sections of the contact pins 42ai through the above-described pores when the positioning member 32 is pressed toward the substrate 38 against biasing forces of the coil springs 36. On the other hand, when the above-described pressing force is released, the positioning member 32 is biased to the remotest position from the substrate 38 by the biasing forces of the coil springs 36 as shown in FIG. 7.

At four corners of the semiconductor device housing section 32A, there are provided positioning protrusions 32P that allow four corners of a package of the semiconductor device to be detachably engaged therewith. In this way, relative positions of the contact pins 42ai of the electrode sections of the semiconductor device, which is engaged with the positioning protrusions 32P, are determined with respect to the contact sections.

The contact pin module includes a substrate 40 to be fixed to the socket body 10, the substrate 38 arranged so as to face the substrate 40, and the contact pins 42ai (i=1 to n, n is a positive integer) arranged between and supported by the substrate 40 and the substrate 38. Each contact pin 42ai is supported by inserting both ends thereof into pores which are formed on the substrate 40 and the substrate 38, and includes a pair of contact terminals that is movably arranged on open ends on both ends of a metal sleeve, and a coil spring arranged between the contact terminals inside the sleeve and configured to bias the pair of contact terminals in a direction away from each other, for example.

As shown in FIG. 2, the operating lever member 12 includes arm sections that extend along side walls constituting long edge sides at an outer shell section of the housing section 10A of the socket body 10, a connecting portion configured to connect ends of the arm sections opposed to each other, and an engaging pin 18 arranged across other ends of the arm sections. Holes into which both ends of the support shaft 26 are inserted are formed on the other ends of the arm sections of the operating lever member 12 in positions adjacent to the engaging pin 18. As shown in FIG. 6, the support shaft 26 penetrates into a through hole at an end of the socket body 10, the base end section of the pressing member support body 14, and the above-described holes on the operating lever member 12. In this way, the operating lever member 12 and the pressing member support body 14 are rotational movably supported. Engaging ends formed on ends of lever members 20A and 20B to be described later are slidably engaged with the engaging pin 18.

Figure 5:
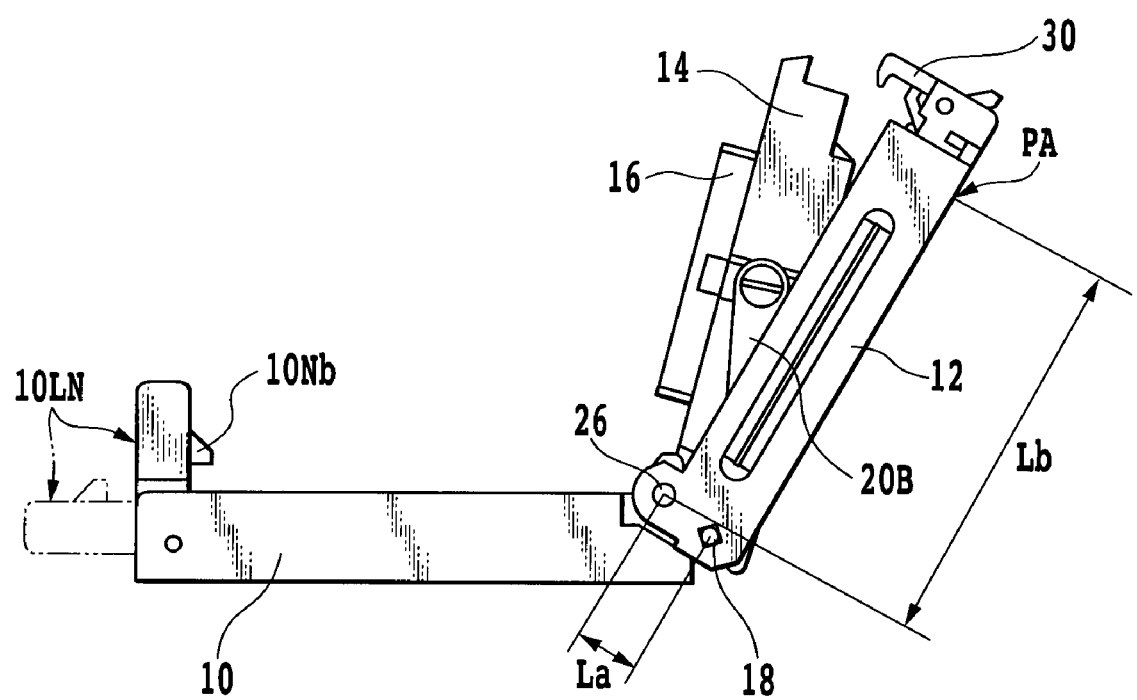
FIG. 5 is a side view showing the side faces of the operating lever member and the socket body in the state illustrated in FIG. 4.

As shown in FIG. 5, a distance Lb along the arm section from a region PA of the arm section of the operating lever member 12 which is a point of application of an operating force to the support shaft 26 is set longer than a mutual distance La between the engaging pin 18 and the support shaft 26. In this way, the engaging ends on the ends of the lever members 20A and 20B to be described later are rendered easily swingable around supporting pins 24A and 24B as shown in FIG. 2 upon application of a relatively small operating force to the regions PA on the arm sections of the operating lever member 12.

In addition, a hook member 30 including a pair of lug sections 30Na formed at a predetermined interval on one end of the hook member 30 is rotational movably arranged on the connecting portion at the arm sections of the operating lever member 12. A coil spring (not shown) configured to bias the lug sections 30Na of the hook member 30 in a direction to be engaged with a pair of lug sections (see FIG. 6) on the socket body 10 is arranged between the other end of the hook member 30 and a concave portion of the connecting portion.

Moreover, torsion coil springs 28 are wound around two positions at portions of the support shaft 26 exposed at the base end section of the pressing member support body 14. The torsion coil springs 28 are configured to bias the pressing member support body 14 in a direction away from the pressing member support body 14. Accordingly, when the latch member 10LN constituting part of the lock-unlock mechanism is in an unlocked state, the operating lever member 12 and the pressing member support body 14 are biased to predetermined standby positions by the biasing forces of the torsion coil springs 28 as shown in FIGS. 4 and 5.

Figure 1:
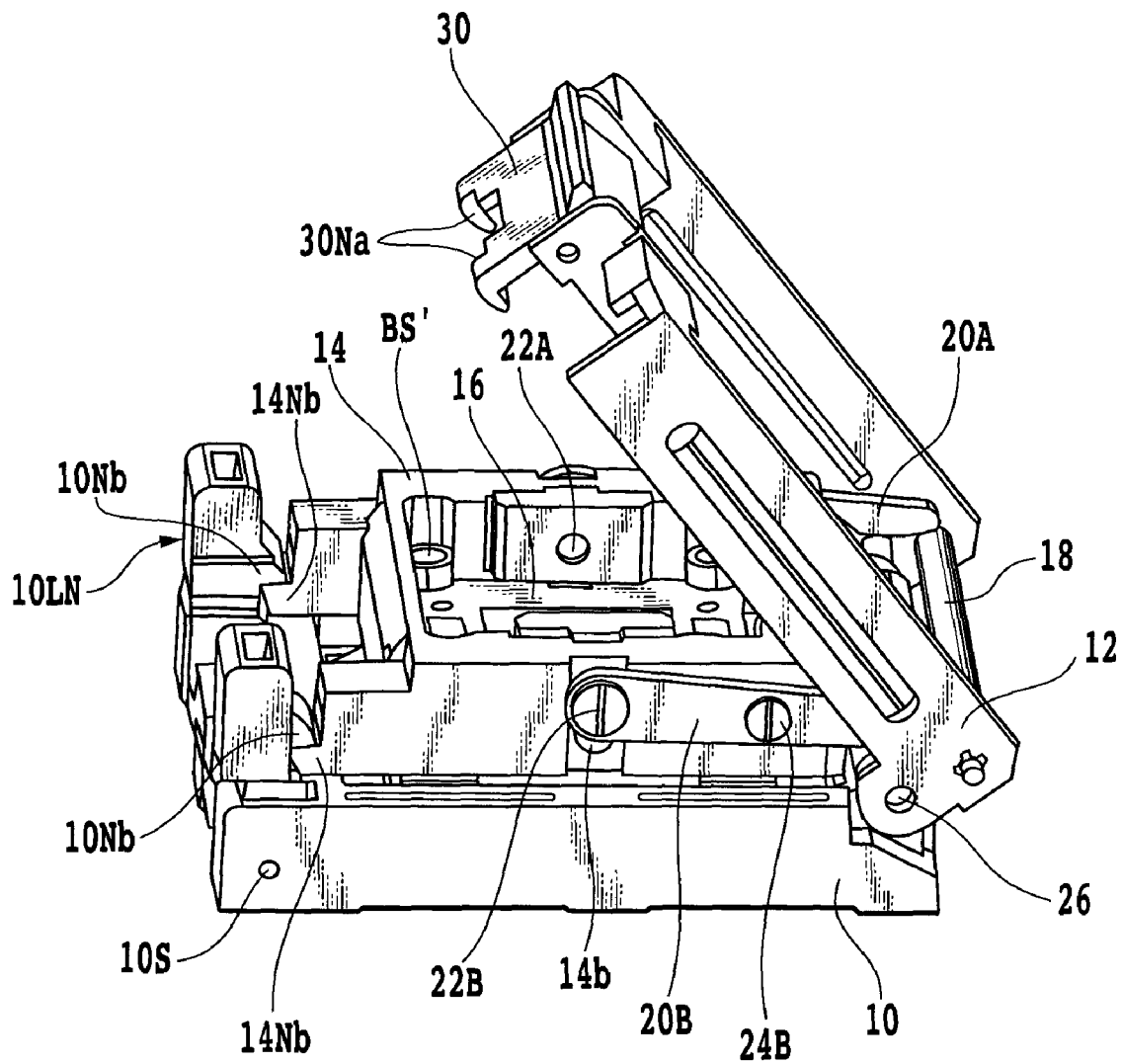
FIG. 1 is a perspective view showing an appearance of a semiconductor device socket according to a first embodiment of the present invention.

As shown in FIGS. 1 and 6, the pressing member support body 14 includes, at its center, an opening 14a which is configured to movably house a pressing member 16. The pressing member 16 includes a pressing surface formed at a lower end section thereof which is configured to press a surface of the semiconductor device. A pair of leg sections 16F of the pressing member 16, which is guided to an inner peripheral surface of the opening 14a, are connected to the lever members 20A and 20B respectively through slots 14b by use of connecting pins 22A and 22B. As shown in FIG. 6, the pressing member 16 includes, at its center, an opening 16H which is configured to attach an unillustrated heat sink.

Each of the slots 14b of the pressing member support body 14 extends almost vertically with respect to an upper end surface and a lower end surface of the pressing member support body 14. The pressing member 16 is biased in a direction to approach the pressing member support body 14, i.e. in a direction to cause the pressing surface thereof to be away from the socket body 10, by way of coil springs (not shown) respectively wound around machine screws Bs that are provided in four positions on the periphery of the opening 14a. In this way, the pressing member 16 is allowed to move along the slots 14b in conjunction with movements of the lever members 20A and 20B. Accordingly, the pressing surface of the pressing member 16 is allowed to move substantially in parallel to the upper end surface and the lower end surface of the pressing member support body 14 without causing an undesirable tilt.

The lever members 20A and 20B are rotational movably supported by the pressing member support body 14 by way of supporting pins 24A and 24B which are respectively inserted into holes provided in intermediate parts of the lever members 20A and 20B. Regarding the lever member 20A, a mutual distance between the connecting pin 22A and the supporting pin 24A is set shorter than a distance between a central axis line of the supporting pin 24A and an engaging end on one end of the lever member 20A. Regarding the lever member 20B, a mutual distance between the connecting pin 22B and the supporting pin 24B is set shorter than a distance between a central axis line of the supporting pin 24B and an engaging end on one end of the lever member 20B.

Therefore, it is possible to reduce a force to move the engaging ends on the ends of the lever members 20A and 20B by way of the principle of leverage.

A pair of lug sections 14Nb is formed with a predetermined interval at a tip end close to the above-described latch member 10LN of the pressing member support body 14. The pair of lug sections 14Nb is respectively engaged with a pair of lug sections 10Nb provided on the latch member 10LN.

The lock-unlock mechanism includes the latch member 10LN made of metal, the pair of lug sections 14Nb on the pressing member support body 14, and the above-described hook member 30 of the operating lever member 12.

The latch member 10N includes the lug sections 10Nb which are formed along the short side of the socket body 10 with the predetermined interval. Moreover, as shown in FIG. 6, in positions of the latch member 10LN corresponding to a space between lug sections 10nc on the socket body 10, there are integrally formed protrusions 10Na which are configured to kick up peripheral parts of the lug sections 30Na of the hook member 30 so as to be disengaged from the lug sections 10nc when the latch member 10LN is rotated counterclockwise to be in the unlocked state, as indicated by a chain double-dashed line in FIG. 5.

Figure 3:
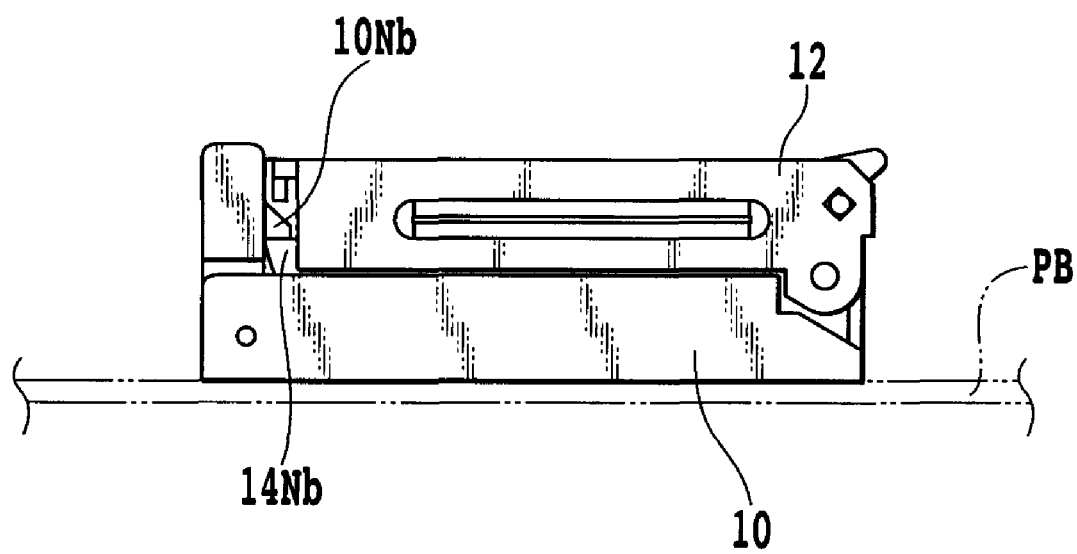
FIG. 3 is a side view showing side faces of the operating lever member and the socket body in the state illustrated in FIG. 2.

In the above-described configuration of the lock-unlock mechanism, when the pressing member support body 14 is locked with respect to the socket body 10 as shown in FIG. 3, the latch member 10LN is rotated counterclockwise to the standby position, as indicated by the chain double-dashed line in FIG. 5, and the pressing member support member 14 is rotated toward the above-described positioning member 32 in that state. Then, lower end surfaces of the pair of the lug sections 14Nb touch on an upper end surface of the socket body 10. Thereafter, by rotating the latch member 10LN clockwise as shown in FIG. 1, the pair of lug sections 14Nb is locked by the lug sections 10Nb as shown in FIGS. 2 and 3, thereby turning the pressing member support body 14 into the locked state. Subsequently, when the operating lever member 12 is locked with respect to the socket body 10, the operating lever member 12 is rotated toward the pressing member support body 14 which is set to the locked state, and then the lug sections 30Na of the hook member 30 are locked by the lug sections 10nc on the socket body 10, thereby turning the operating lever member 12 into the locked state with respect to the socket body 10.

On the other hand, when the operating lever member 12 and the pressing member support body 14 are unlocked from the socket body 10, the latch member 10LN is rotated counterclockwise to the standby position. In this way, the protrusions 10Na on the latch member 10LN kick up the peripheral parts of the lug sections 30Na of the hook member 30 so as to be disengaged from the lug sections 10nc. At the same time, the operating lever member 12 and the pressing member support body 14 are rotated back to initial positions almost simultaneously as shown in FIG. 4 by way of an elastic force of the torsion coil springs 28.

Further, in order to fit the semiconductor device DV onto the positioning member 32 of the socket body 10, the semiconductor device DV is firstly fitted into the semiconductor device housing section 32A of the positioning member 32, and then the pressing member support body 14 is locked with respect to the socket body 10 as shown in FIG. 1. Here, a predetermined clearance is defined between the pressing surface of the pressing member 16 and an upper surface of a package of the semiconductor device DV. Moreover, the pressing surface of the pressing member 16 and the upper surface of the package of the semiconductor device DV are set substantially parallel to each other.

Therefore, the operating force required to turn the latch member 10LN into the locked state is relatively small because it is only necessary to rotate the pressing member support body 14 against the biasing forces of the torsion coil springs 28.

Next, the operating lever member 12 is rotated around the support shaft 26 toward the pressing member support body 14 which is set to the locked state. Here, the engaging pin 18 is rotated around the support shaft 26. Accordingly, the engaging ends on the ends of the lever members 20A and 20B are respectively rotated upward around the supporting pins 24A and 24B. In this way, the pressing surface of the pressing member 16 is moved down against the biasing forces of the coil springs and touches on and presses the upper surface of the package of the semiconductor device at a predetermined pressure. Here, the pressing surface of the pressing member touches on the upper surface of the package of the semiconductor device substantially in parallel thereto. Accordingly, the uniform pressure is applied to the upper surface of the package of the semiconductor device.

In addition, in order to take the semiconductor device DV out of the positioning member 32 of the socket body 10, the latch member 10LN is rotated counterclockwise to the standby position as described previously. In this way, the protrusions 10Na on the latch member 10LN kick up the peripheral parts of the lug sections 30Na of the hook member 30 so as to be disengaged from the lug sections 10nc. At the same time, the operating lever member 12 and the pressing member support body 14 are rotated almost simultaneously back to the initial positions as shown in FIGS. 4 and 5 by way of the elastic force of the torsion coil springs 28. Thereafter, the semiconductor device DV can be taken out of the positioning member 32 of the socket body 10.

Therefore, it is possible to turn the operating lever member 12 and the pressing member support body 14 into the unlocked state by only one operation using the latch member 10LN.

Figure 8:
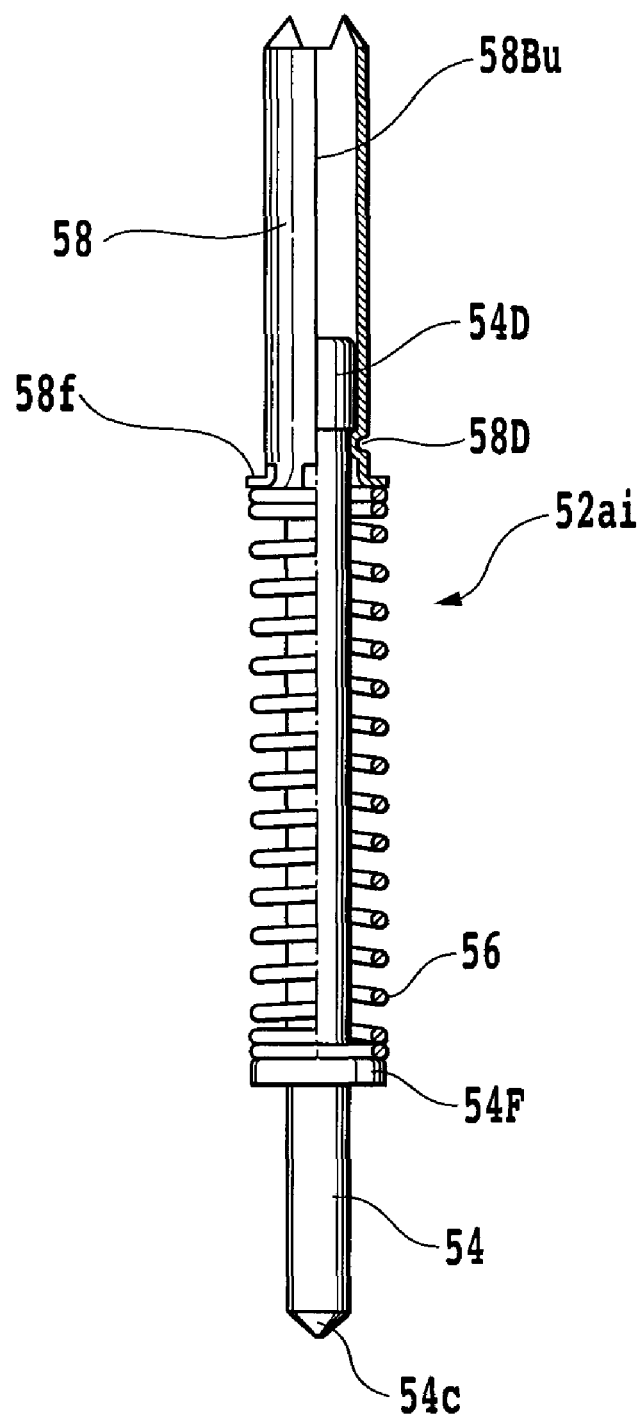
FIG. 8 is a front view showing another example of contact pins used in the contact pin module in the example illustrated in FIG. 1, including a partial cross-sectional view thereof.

FIG. 8 shows an enlarged view of another example of one of contact pins used in the above-described contact pin module. In the following description of FIGS. 13A to 13C, the same constituents as those appearing in FIG. 7 will be designated by the same reference numerals and duplicate explanation will be omitted.

In FIG. 8, each of contact pins 52$ai$ (i=1 to n, n is a positive integer) includes a sleeve 58 having multiple contact sections 58n configured to touch on an electrode section DVb of the semiconductor device DV, a plunger 54 having a contact section 54c configured to touch on an electrode section of the printed circuit board PB, and a coil spring 56 configured to bias the plunger 54 in a direction away from the sleeve 58.

Figure 9:
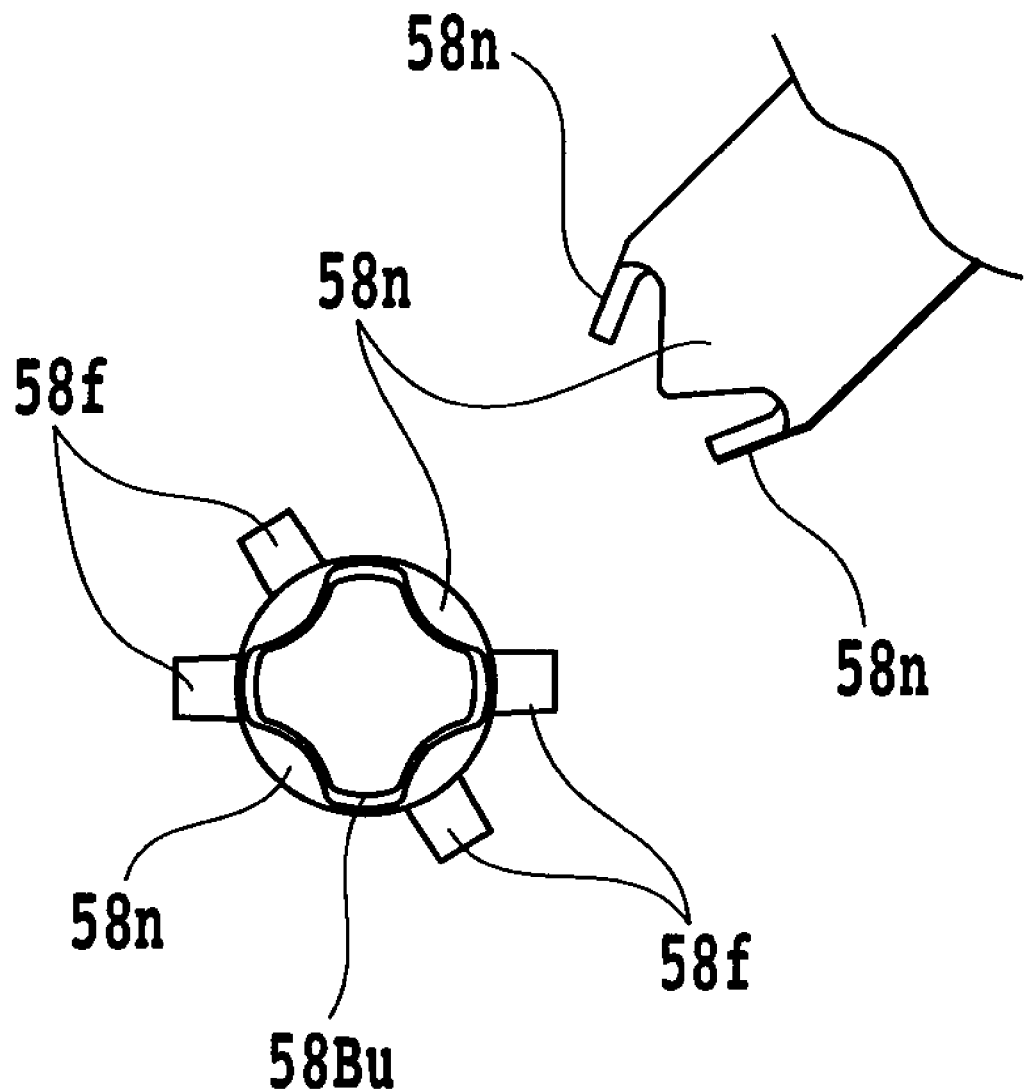
FIG. 9 is a plan view of a sleeve in the example illustrated in FIG. 8.
Figure 11:
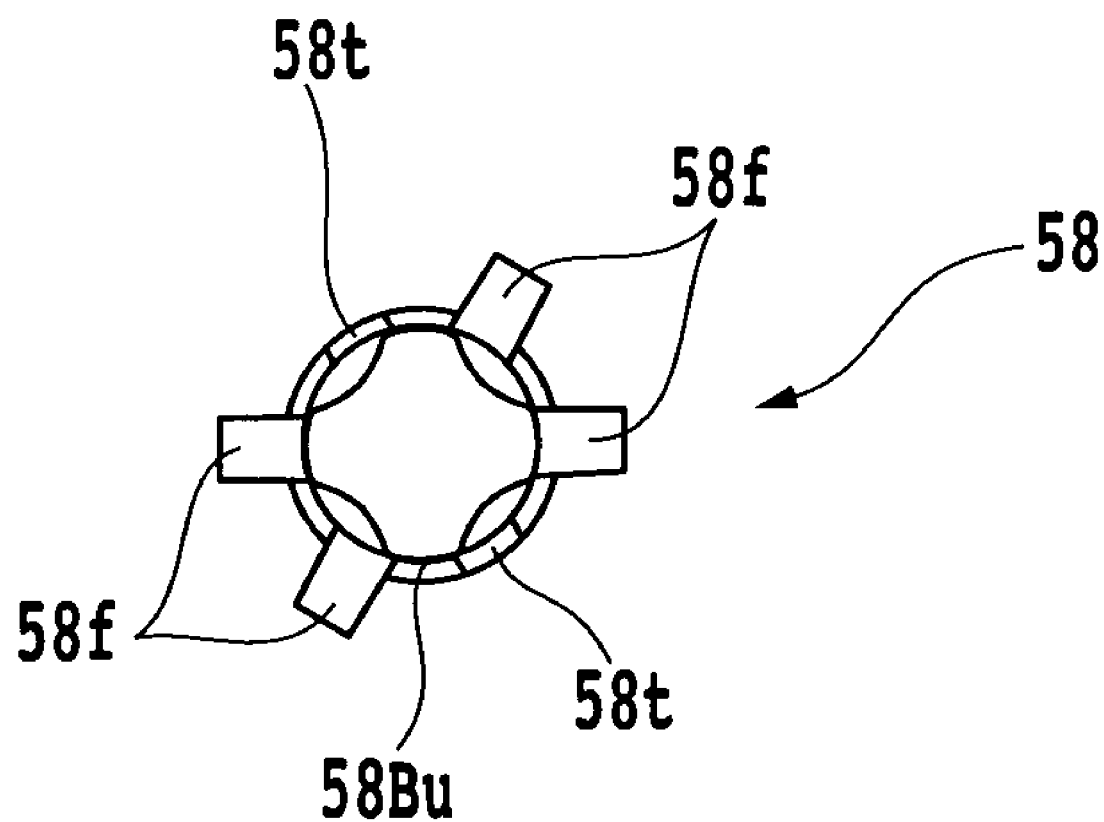
FIG. 11 is a bottom view of the sleeve in the example illustrated in FIG. 8.
Figure 12:
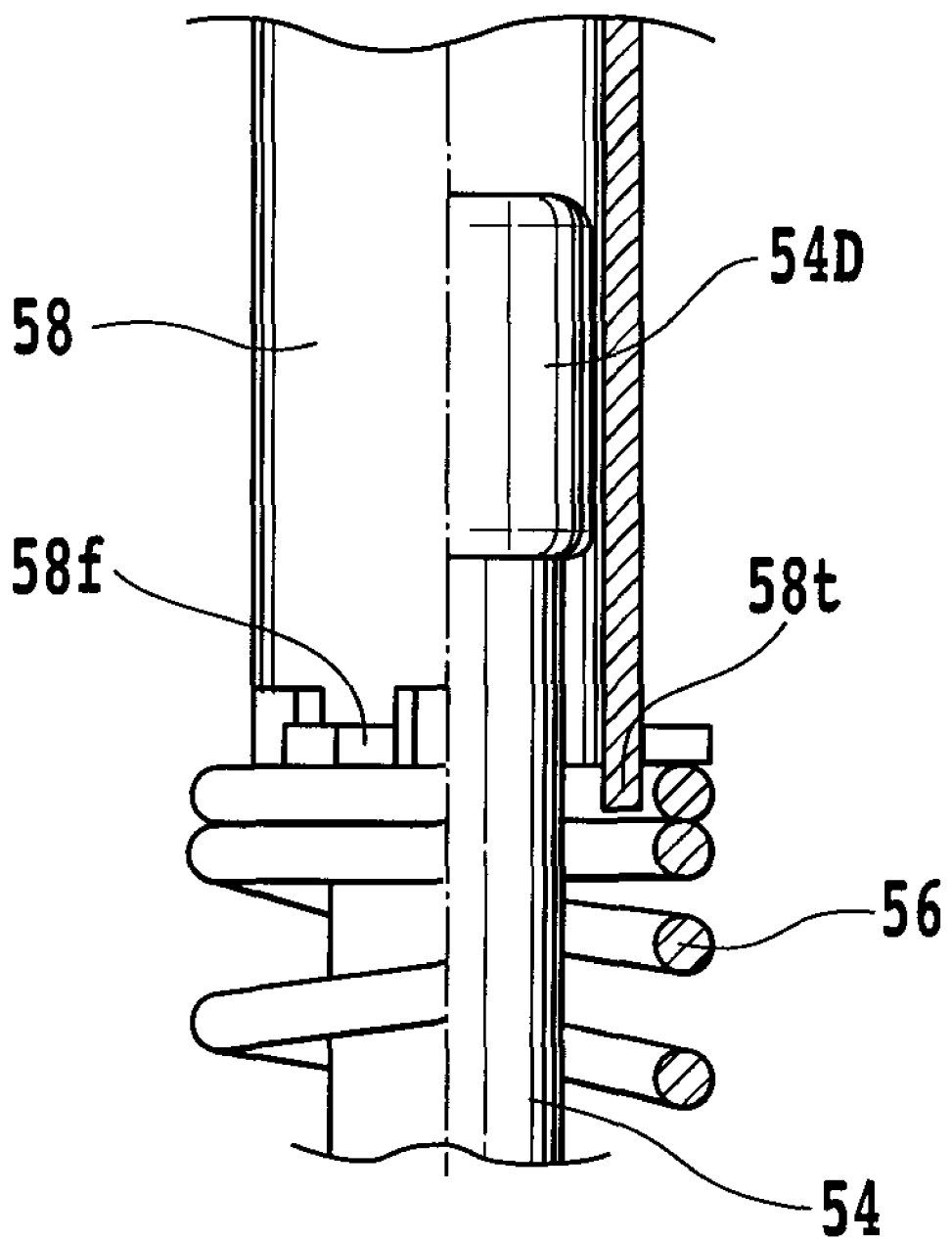
FIG. 12 is a partial cross-sectional view showing partially enlarged the sleeve and a plunger in the example illustrated in FIG. 8.

The sleeve 58 is formed into a cylindrical shape by press work using a thin plate metal material such as a phosphor bronze material. Accordingly, the sleeve 58 includes a seam 58Bu along a center axis line thereof. As enlarged and shown in FIG. 9, four tapered contact sections 58n are formed at one end of the sleeve 58 on a common circumference at intervals of about 90 degrees. In addition, as enlarged and shown in FIG. 11, spring receivers 58f are formed in four positions on the other end of the sleeve 58 so as to receive an end of the coil spring 56. As shown in FIGS. 11 and 12, protrusions 58t for tentatively catching the coil spring are integrally formed in spaces between the two pairs of the spring receivers 58f so as to protrude by a predetermined length along the center axis line of the sleeve 58.

Figure 10:
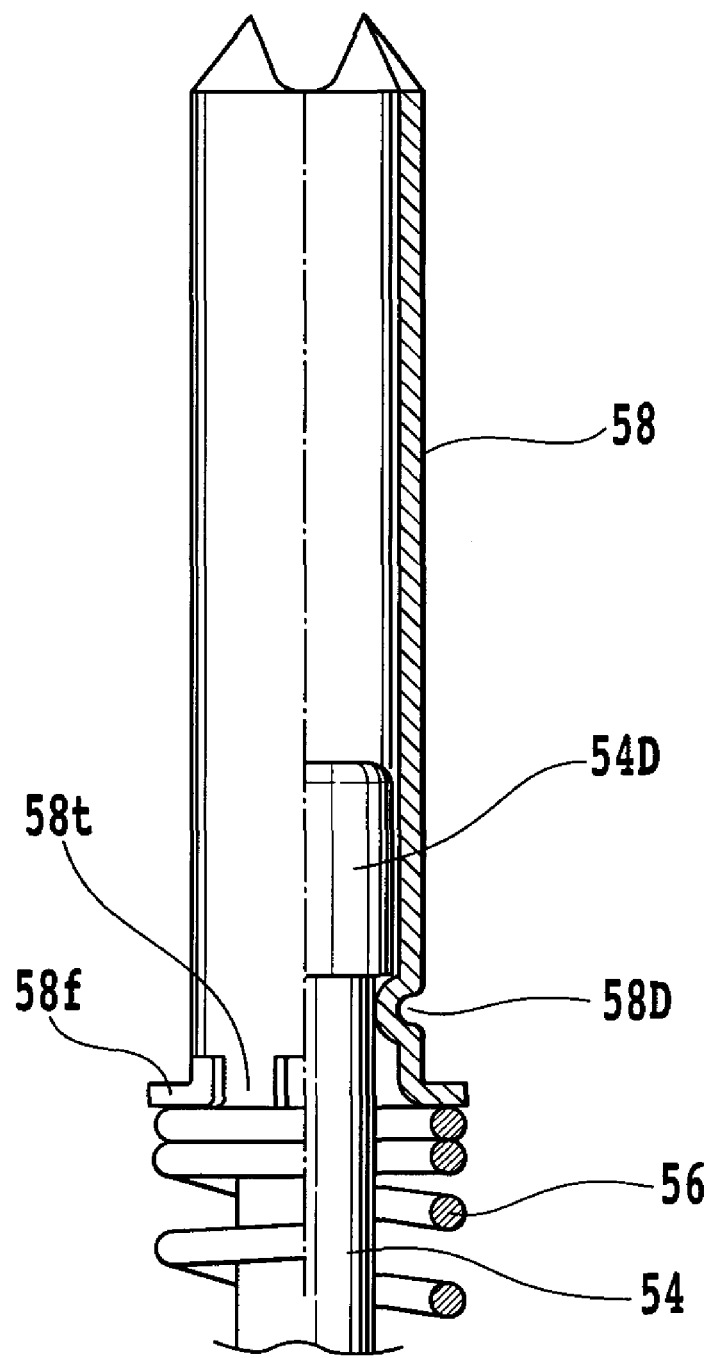
FIG. 10 is a partial cross-sectional view of the sleeve in the example illustrated in FIG. 8.

Moreover, as enlarged and shown in FIG. 10, a single nib 58D is formed in a predetermined position close to the protrusions 58t and the spring receivers 58f. The nib 58D formed substantially in a circular shape is configured to prevent a large-diameter section 54D of the plunger 54 that is inserted into the sleeve 58 from falling off the sleeve 58.

Figure 13C:
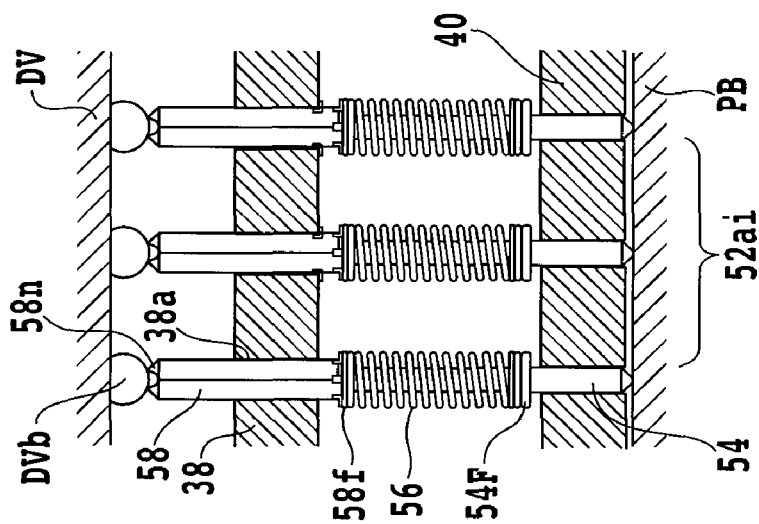
FIGS. 13A to 13C are cross-sectional views made available for explaining operations of the contact pins illustrated in FIG. 8.
Figure 13B:
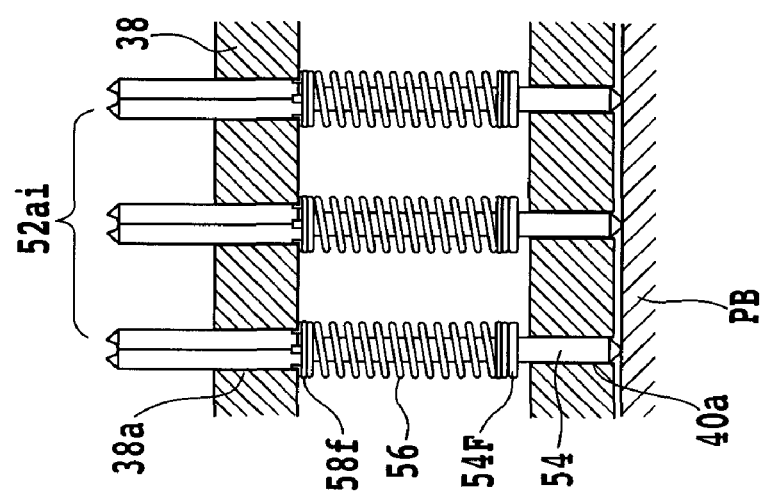

The plunger 54 includes, at its one end, the large-diameter section 54D configured to be inserted into the sleeve 58, and, at its other end, a tapered contact section 54c. Moreover, a flange section 54F is integrally formed in a position away from the contact section 54c by a predetermined distance. As shown in FIG. 8, one of surfaces of the flange section 54F catches the other end of the coil spring 56. In addition, as shown in FIGS. 13A to 13C, the other surface of the flange section 54F selectively touches on a surface on the periphery of a hole 40a on the substrate 40.

Figure 13A:
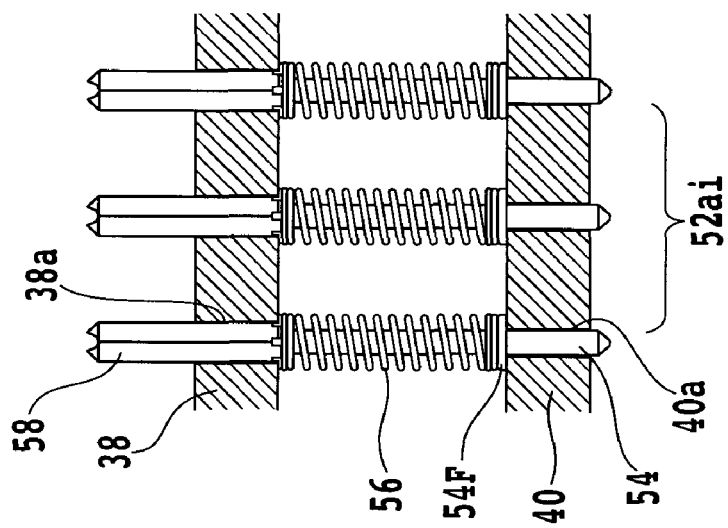

The spring receivers 58f of the sleeves 58 and the flange sections 54F of the plungers 54 of the contact pins 52ai incorporated between the substrate 40 and the substrate 38 in the contact pin module respectively touch on inner surface of the substrate 38 and the substrate 40 as shown in FIG. 13A by way of the biasing forces of the coil springs 58 before the contact pin module is mounted on the printed circuit board PB. Next, when the contact pin module is mounted on the printed circuit board PB as shown in FIG. 13B, the large-diameter sections 54D of the plungers 54 are pulled into the sleeves 58 as the contact sections 54c are pressed on the printed circuit board PB whereby the flange sections 54F of the plungers 54 are separated from the inner surface on the periphery of the holes 40a on the substrate 40. Thereafter, when the semiconductor device DV is fitted as shown in FIG. 13C, the contact sections 58n of the sleeves 58 touch on the electrode sections DVb of the semiconductor device DV and then the contact sections 58n of the sleeves 58 are pressed against the biasing forces of the coil springs 56. Accordingly, inner peripheral surfaces of the sleeves 58 slide on outer peripheral surfaced of the large-diameter sections 54D of the plungers 54 whereby the spring receivers 58f are separated from the surface on the periphery of holes 38a on the substrate 38.

In the above-described example, the nib 58D substantially in the circular shape is formed on each of the sleeves 58. However, the present invention is not limited only to this configuration. For example, as enlarged and shown in FIGS. 14A and 14B, it is also possible to form a nib 58'D in a rectangular shape in a position on a sleeve 58' adjacent to a protrusion 58't for tentatively stopping a spring receiver 58'f and the coil spring 56.

Figure 15:
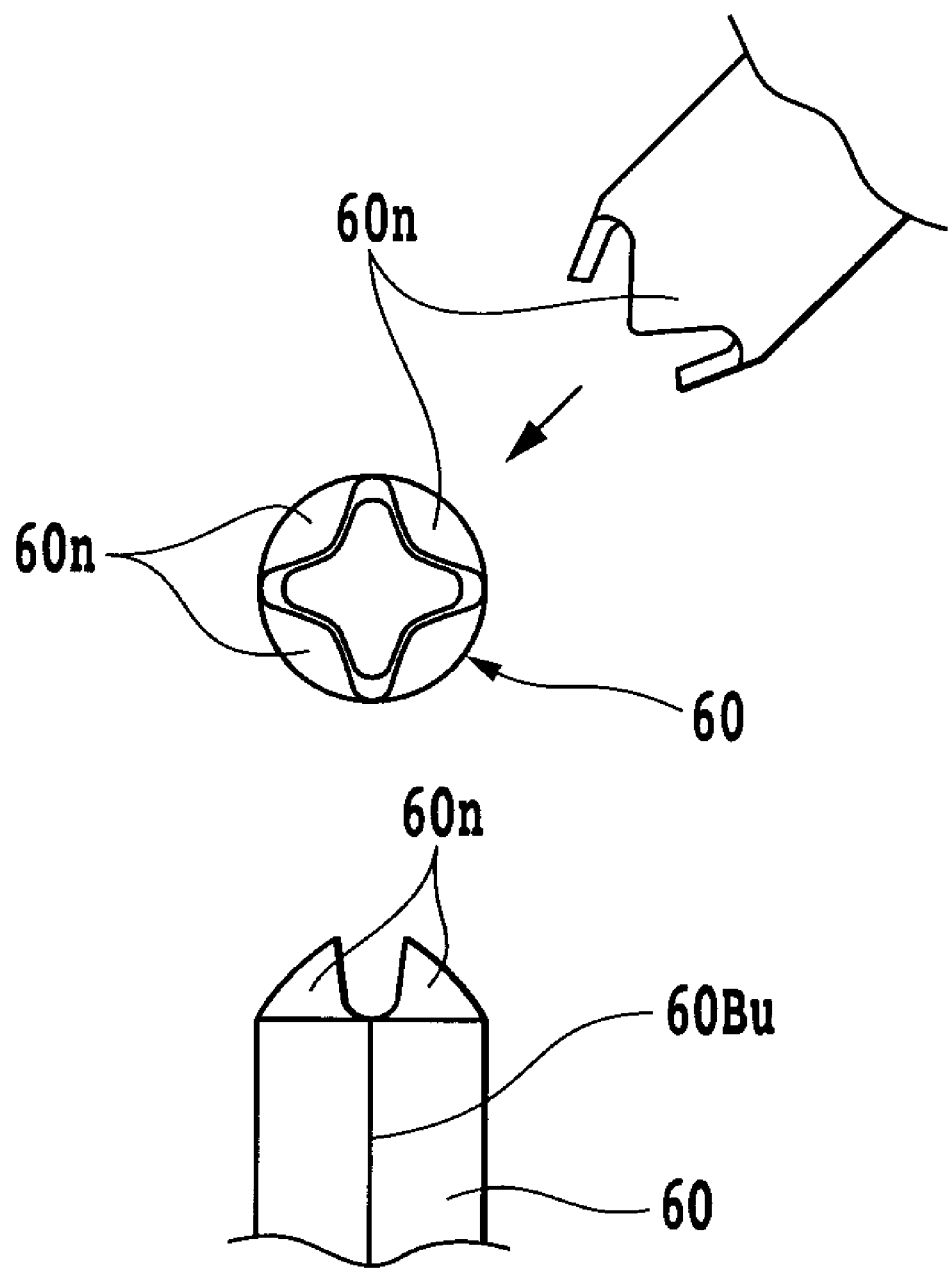
FIG. 15 is a view showing partially enlarged another modification of the sleeve in the example illustrated in FIG. 8.
Figure 16:
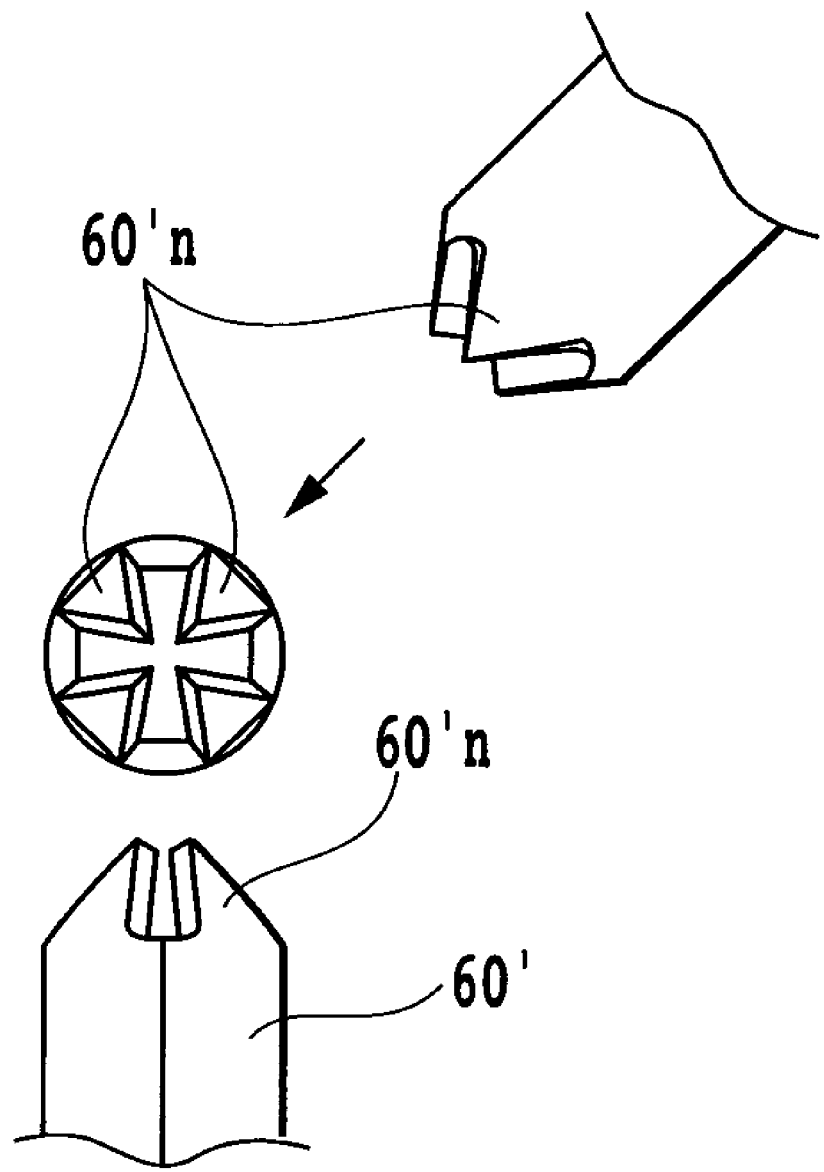
FIG. 16 is a view showing partially enlarged still another modification of the sleeve in the example illustrated in FIG. 8.

Additionally, the above-described contact sections 58n of the sleeve 58 are formed in four positions on the circumference having a predetermined diameter at intervals of about 90 degrees. However, such a predetermined diameter is not limited only to this configuration. For example, as respectively shown in FIGS. 15 and 16, it is also possible to form contact sections 60n of a sleeve 60 and contact sections 60'n of a sleeve 60' respectively on circumferences having smaller diameters in accordance with the sizes of the electrode sections DVb of the semiconductor devices DV or to specifications of relative positions between the contact sections and the electrode sections DVb. In FIG. 15, the sleeve 60 has a butt portion 60Bu along a center axis line thereof.

Figure 17:
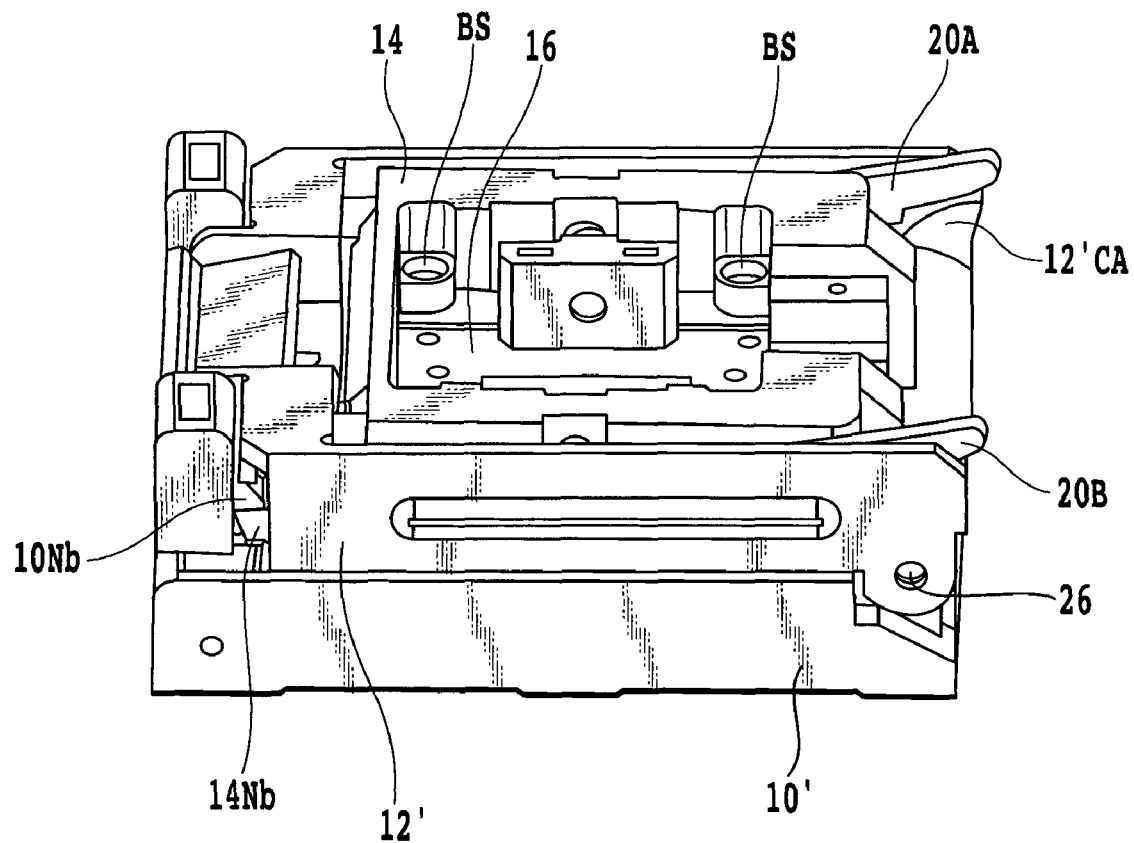
FIG. 17 is a perspective view showing an appearance of a semiconductor device socket according to a second embodiment of the present invention.

FIG. 17 shows an appearance of a semiconductor socket according to a second embodiment of the present invention. In FIG. 17, the same constituents as those in the example shown in FIG. 2 will be designated by the same reference numerals and duplicate explanation will be omitted.

In FIG. 17, the operating lever member 12 includes the engaging pin 18 with which the engaging ends on the ends of the lever members 20A and 20B are slidably engaged. Instead, in the example shown in FIG. 17, an operating lever member 12' does not include the engaging pin 18 but includes a pair of cam sections 12'CA with which the respective engaging ends on the ends of the lever members 20A and 20B are slidably engaged. The cam sections 12'CA are respectively provided inside a base end section of the operating lever member 12'.

Each of the cam sections 12'CA includes a cam surface configured to kick up the engaging end on the end of the lever member 20A or 20B to the highest position in a locked state of the operating lever member 12' as shown in FIG. 17 and to lift down the engaging end on the end of the lever member 20A or 20B to the lowest position in an unlocked state of the operating lever member 12'.

Figure 18:
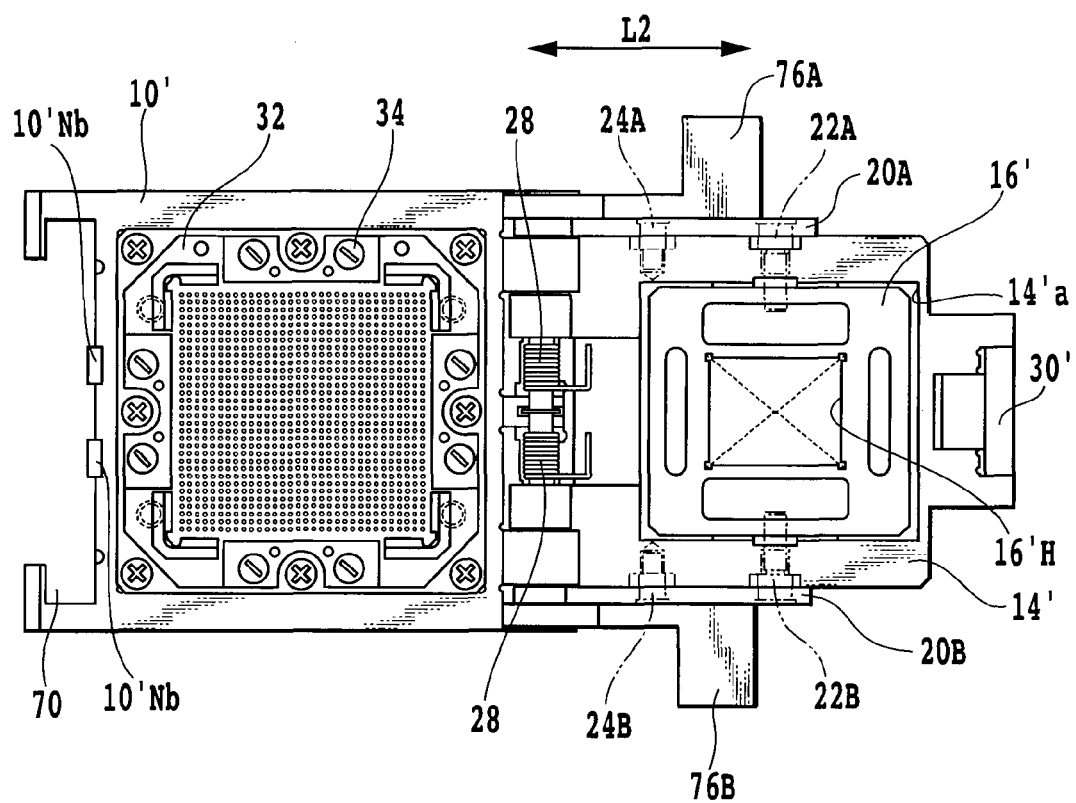
FIG. 18 is a plan view showing an appearance of a semiconductor device socket according to a third embodiment of the present invention.

FIG. 18 shows an appearance of a semiconductor device socket according to a third embodiment of the present invention.

Figure 19:
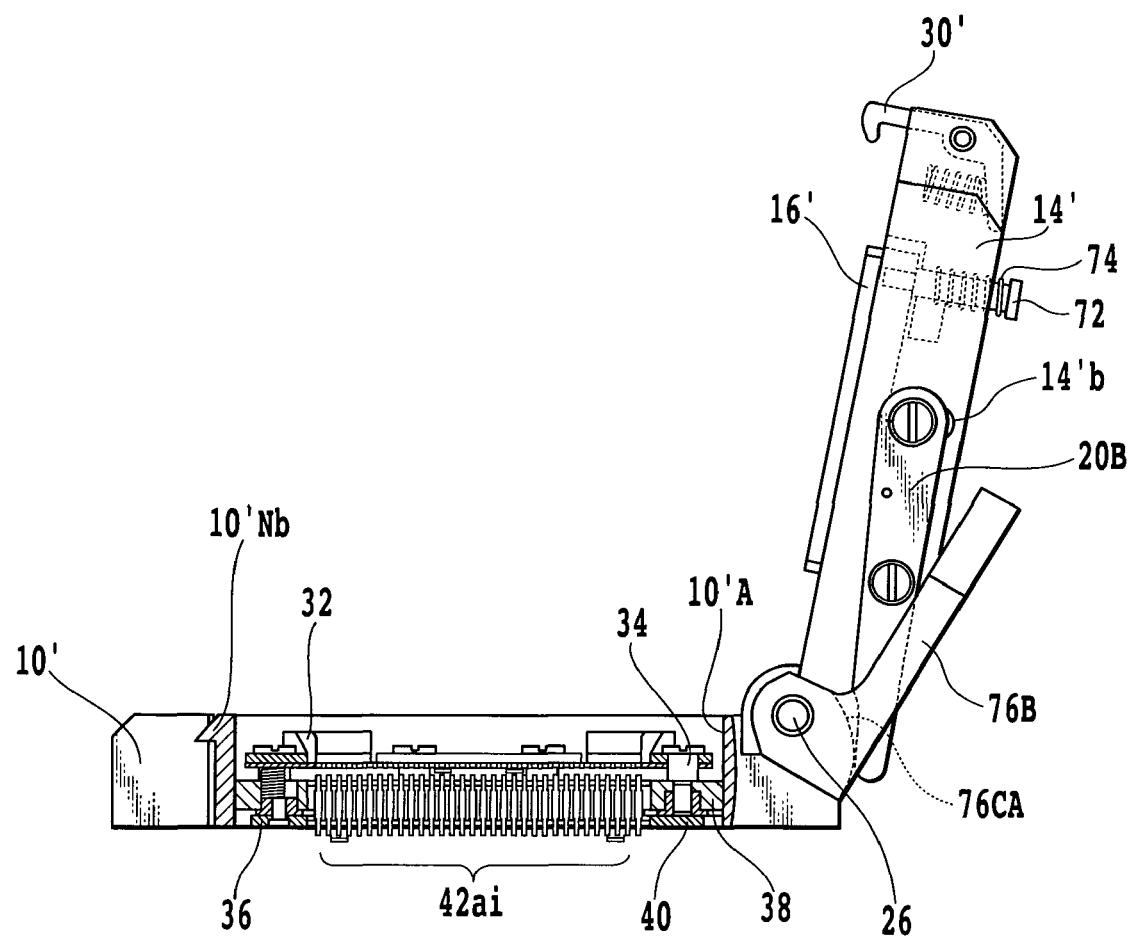
FIG. 19 is a side view of the example illustrated in FIG. 18.
Figure 20:
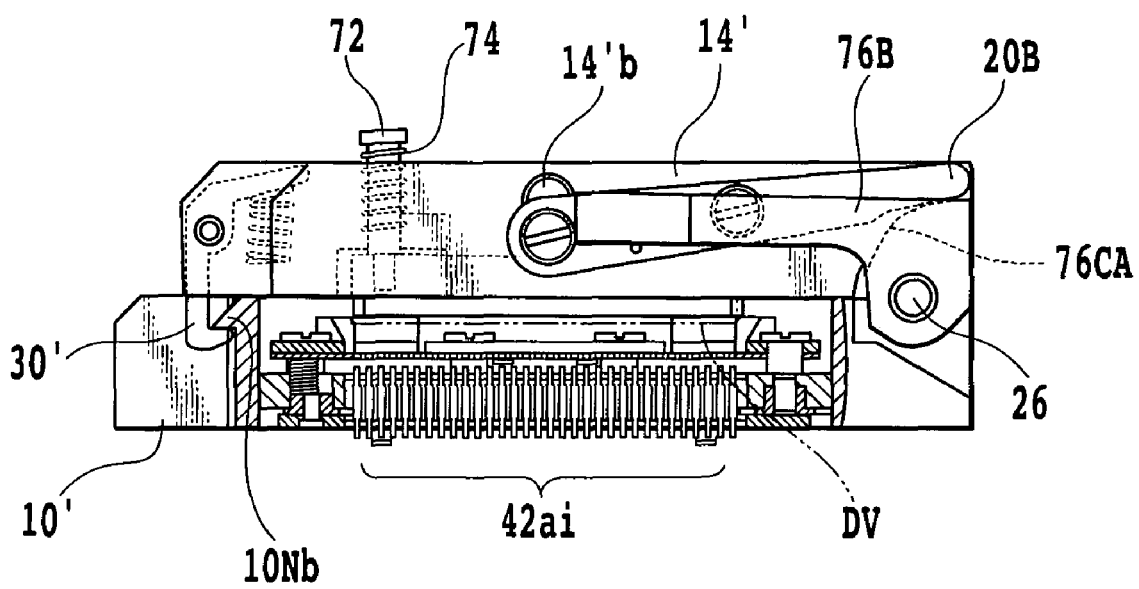
FIG. 20 is a side view of the example illustrated in FIG. 18, showing a pressing member support body in a locked state with respect to the socket body.

In FIGS. 18 to 20, the same constituents as those appearing in the example shown in FIG. 6 will be designated by the same reference numerals and duplicate explanation will be omitted.

In FIG. 18, the semiconductor device socket includes: a socket body 10' having, at its center, a positioning member 32 serving as a semiconductor device mounting section and a housing section 10'A for housing a contact pin module; a pressing member support body 14' having one end rotational movably supported by the socket body 10' and being configured to support a pressing member 16' to be described later so as to be movable inward; operating lever members 76A and 76B each having one end rotational movably supported by the socket body 10' and being configured to operate lever members 20A and 20B that are rotational movably supported by the pressing member support body 14'; and a lock-unlock mechanism configured to lock or unlock the pressing member support body 14' to or from the socket body 10'. FIG. 20 shows a state where the pressing member support body 14' is locked with respect to the socket body 10'.

As shown in FIGS. 18 and 19, base end portions of the pressing member support body 14' and of the operating lever members 76A and 76B are rotational movably supported on one of short sides of the socket body 10' by use of a support shaft 26 that penetrates into one end side on the periphery of the housing section 10'A in the center.

The contact pin module and the positioning member 32 are arranged inside the housing section 10'A.

Each of the operating lever members 76A and 76B includes an arm section that extends along a side wall constituting a long edge side at an outer shell section of the housing section 10'A of the socket body 10', and a cam section 76CA to be formed at a base end section of the arm section. Holes into which both ends of the support shaft 26 penetrates are formed on the other ends of the arm sections of the operating lever members 76A and 76B. The support shaft 26 penetrates into a through hole at an end of the socket body 10', the base end section of the pressing member support body 14', and the above-described holes on the operating lever members 76A and 76B. In this way, the operating lever members 76A and 76B as well as the pressing member support body 14' are rotational movably supported. Engaging ends formed on ends of the lever members 20A and 20B are slidably engaged with the cam sections 76CA. In this way, the engaging ends on the ends of the lever members 20A and 20B are rendered easily swingable around supporting pins 24A and 24B as an operating force is applied to the arm sections of the operating lever members 76A and 76B.

Moreover, torsion coil springs 28 are wound around two positions at portions of the support shaft 26 exposed at the base end section of the pressing member support body 14'. The torsion coil springs 28 are configured to bias the pressing member support body 14' in a direction away from the socket body 10'. Accordingly, when a hook member 30' constituting part of the lock-unlock mechanism is in an unlocked state, the pressing member support body 14' is biased to a predetermined standby position by the biasing forces of the torsion coil springs 28.

Figure 22:
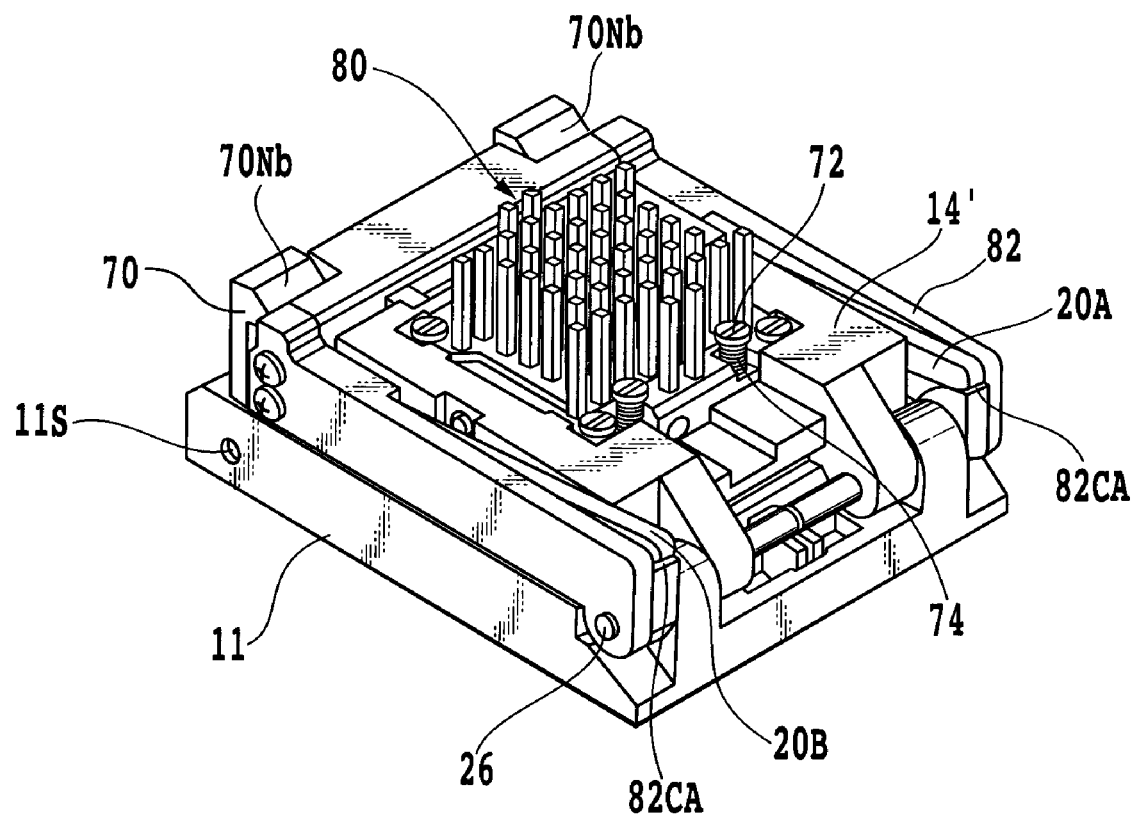
FIG. 22 is a perspective view showing an appearance of a semiconductor device socket according to a fourth embodiment of the present invention.

The pressing member support body 14' includes, at its center, an opening 14'a which is configured to movably house a pressing member 16' therein. The pressing member 16' includes a pressing surface formed at a lower end section thereof which is configured to press a surface of the semiconductor device. An outer peripheral surface of the pressing member 16' to be guided to an inner peripheral surface of the opening 14'a is connected to the lever members 20A and 20B respectively through slots 14'b by use of connecting pins 22A and 22B. As shown in FIG. 22, the pressing member 16' includes, at its center, an opening 16'H which is configured to attach an unillustrated heat sink.

Each of the slots 14'b of the pressing member support body 14' extends almost vertically with respect to an upper end surface and a lower end surface of the pressing member support body 14'. The pressing member 16' is biased in a direction to approach the pressing member support body 14', i.e. in a direction to cause the pressing surface thereof to be away from the socket body 10', by way of coil springs 74 respectively wound around machine screws 72 that are provided in four positions at a portion constituting a bottom section of the opening 14'a. In this way, the pressing member 16' is allowed to move along the slots 14'b in conjunction with movements of the lever members 20A and 20B. Accordingly, the pressing surface of the pressing member 16' is allowed to move substantially in parallel to the upper end surface and the lower end surface of the pressing member support body 14' without causing an undesirable tilt.

In the pressing member support body 14', the hook member 30' including a pair of lug sections to be respectively engaged with a pair of lug sections 10'Nb is rotational movably provided at a tip end close to the lug sections 10'Nb of the socket body 10'. The lug sections of the hook member 30' are biased in a direction to be respectively engaged with the pair of lug sections 10'Nb by use of coil springs.

The lock-unlock mechanism includes the pair of lug sections 10'Nb of the socket body 10', and the above-described hook member 30' of the pressing member support body 14'.

Further, in order to fit the semiconductor device DV onto the positioning member 32 of the socket body 10', the semiconductor device DV is firstly fitted into a semiconductor device housing section 32A of the positioning member 32, and then the pressing member support body 14' is locked with respect to the socket body 10' as shown in FIG. 20. Here, a predetermined clearance is defined between the pressing surface of the pressing member 16' and the upper surface of the package of the semiconductor device DV. The pressing surface of the pressing member 16' and the upper surface of the package of the semiconductor device DV are set substantially parallel to each other.

Therefore, the operating force required herein is relatively small because it is only necessary to rotate the pressing member support body 14' against the biasing forces of the torsion coil springs 28.

Next, the operating lever members 76A and 76B are rotated around the support shaft 26. Here, the engaging ends on the ends of the lever members 20A and 20B are respectively rotated upward around the supporting pins 24A and 24B. In this way, the pressing surface of the pressing member 16' is moved down against the biasing forces of the coil springs and touches on and presses the upper surface of the package of the semiconductor device at a predetermined pressure. Here, the pressing surface of the pressing member 16' touches on the upper surface of the package of the semiconductor device substantially in parallel thereto. Accordingly, the uniform pressure is applied to the upper surface of the package of the semiconductor device.

In addition, in order to take the semiconductor device DV out of the positioning member 32 of the socket body 10', the lug sections of the hook member 30' are disengaged from the lug sections 10'Nb of the socket body 10', whereby the pressing member support body 14' is rotated back to the initial position by way of the resilience of the torsion coil springs 28. Thereafter, the semiconductor device DV can be taken out of the positioning member 32 of the socket body 10'.

Figure 21:
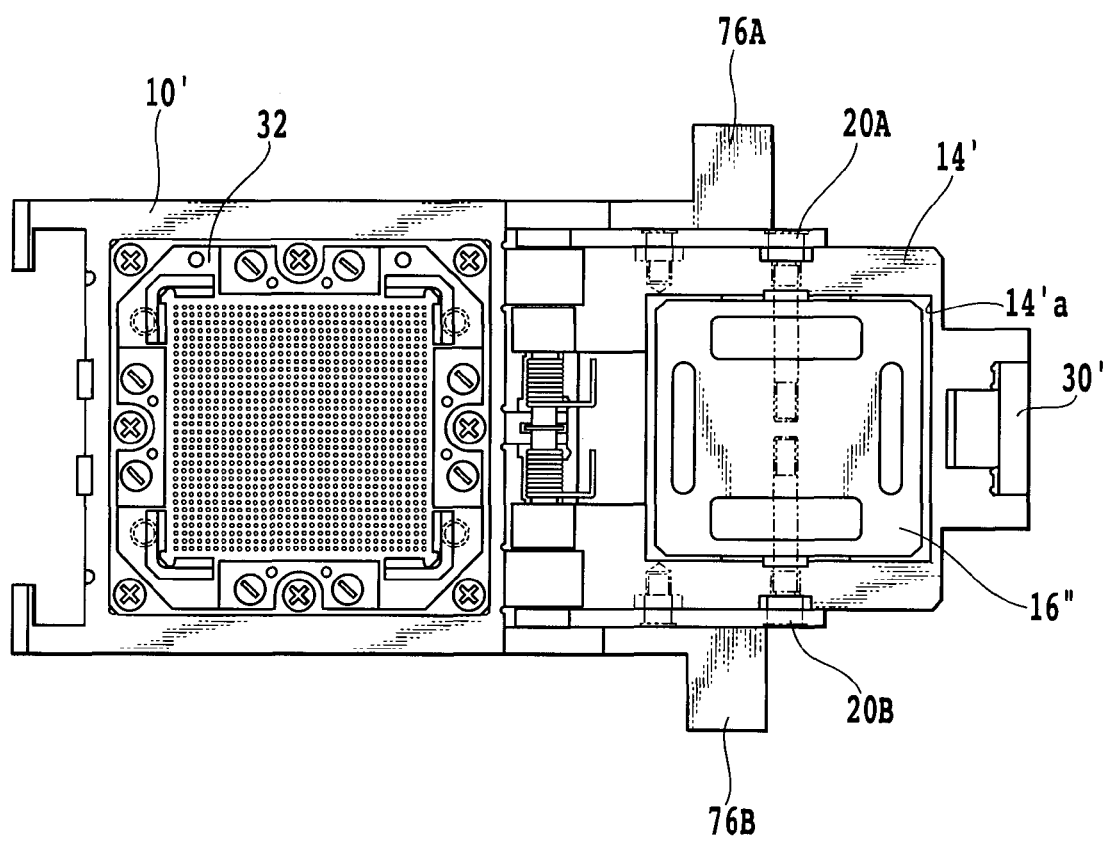
FIG. 21 is a plan view showing a modification of a pressing member in the example illustrated in FIG. 18.

In the above-described example, the pressing member 16' includes an opening 16'H for attaching the heat sink which is provided at the central part thereof. However, the present invention is not limited only to this configuration. For example, as shown in FIG. 21, the pressing member 16" does not have to include the aforementioned fitting opening. Here, in FIG. 21, the same constituents as those appearing in the example shown in FIG. 18 will be designated by the same reference numerals and duplication explanation will be omitted.

FIG. 22 shows an appearance of a semiconductor device socket according to a fourth embodiment of the present invention.

In FIGS. 22 to 25D, the same constituents as those appearing in the example shown in FIG. 18 will be designated by the same reference numerals and duplicate explanation will be omitted.

In FIG. 22, the semiconductor device socket includes: a socket body 11 having, at its center, a positioning member 32 serving as a semiconductor device mounting section and a housing section 11A for housing a contact pin module; a pressing member support body 14' having one end rotational movably supported by the socket body 11 and being configured to support a pressing member to be described later so as to be movable inward; an operating lever member 82 having one end rotational movably supported by the socket body 11 and being configured to operate lever members 20A and 20B that are rotational movably supported by the pressing member support body 14'; and a lock-unlock mechanism configured to lock or unlock the pressing member support body 14' and the operating lever member 82 to or from the socket body 11.

FIG. 22 shows a state where the pressing member support body 14' and the operating lever member 82 are locked with respect to the socket body 11.

Base end portions of the pressing member support body 14' and of the operating lever member 82 are rotational movably supported on one of short sides of the socket body 11 by use of a support shaft 26 that penetrates into one end side on the periphery of the housing section 11A in the center. In addition, a base end section of a latch member 70 constituting part of the lock-unlock mechanism to be described later is rotational movably supported on the other short side of the socket body 11 by use of a support shaft 11S that penetrates into the other end side on the periphery of the housing section 11A in the center.

The contact pin module and the positioning member 32 are arranged inside the housing section 11A.

Figure 23:
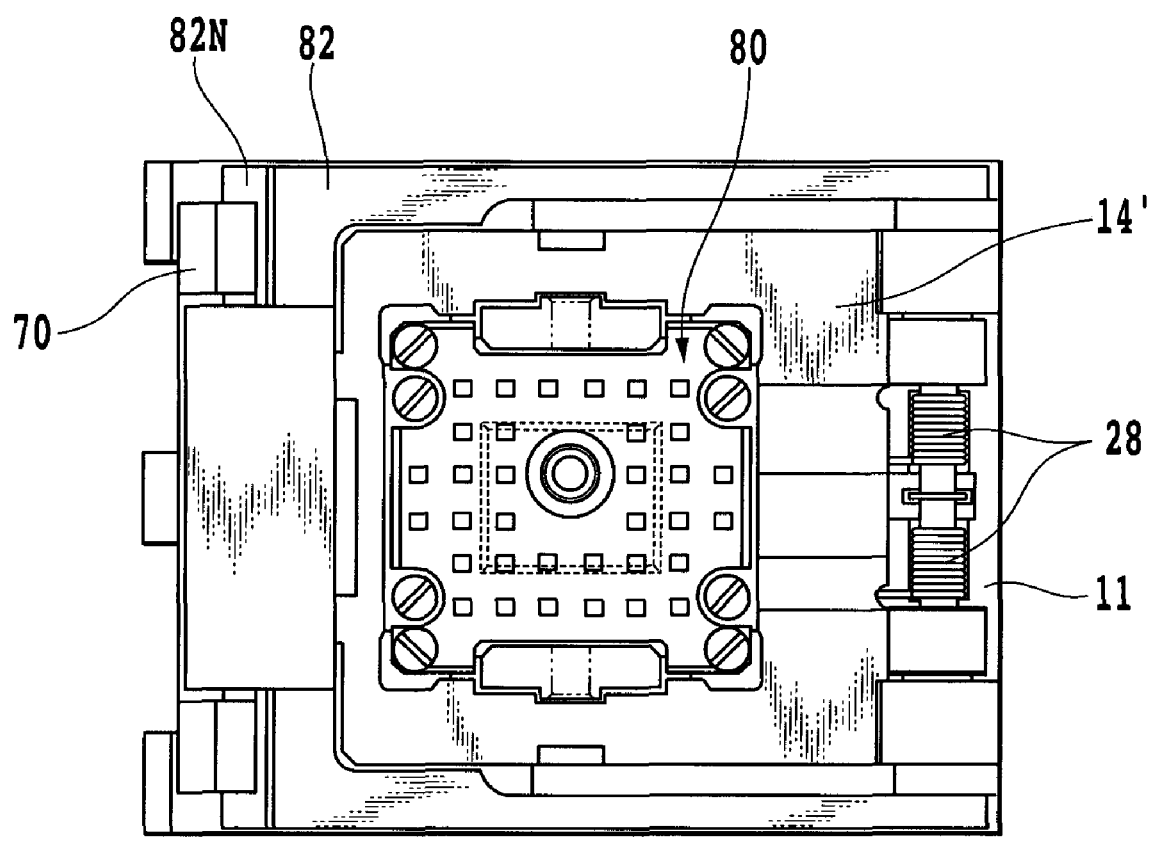
FIG. 23 is a plan view of the example illustrated in FIG. 22.

As shown in FIG. 23, the operating lever member 82 includes arm sections that extend along side walls constituting long edge sides at an outer shell section of the housing section 11A of the socket body 11, and a connecting portion configured to connect ends of the arm sections opposed to each other. Holes into which both ends of the support shaft 26 penetrate are formed on the other ends of the arm sections of the operating lever member 82. As shown in FIG. 6, the support shaft 26 penetrates into a through hole at an end of the socket body 11, the base end section of the pressing member support body 14', and the above-described holes on the operating lever member 82. In this way, the operating lever member 82 and the pressing member support body 14' are rotational movably supported.

Cam sections 82CA are formed on the periphery of the holes into which the support shaft 26 penetrates inside the arm sections of the operating lever member 82. The engaging ends on the ends of the lever members 20A and 20B to be described later are slidably engaged with the cam sections 82CA.

As shown in FIG. 5, a distance along the arm section from a region of the arm section of the operating lever member 82 which is a point of application of an operating force to the support shaft 26 is set longer than a distance from a center axis line of the supports shaft 26 to a cam surface of the cam section 82CA. In this way, the engaging ends on the ends of the lever members 20A and 20B are rendered easily swingable around supporting pins 24A and 24B upon application of a relatively small operating force to the arm sections of the operating lever member 82.

Moreover, as apparent from FIG. 18, the distance along the arm section from the region of the arm section of the operating lever member 82 being the point of application of the operating force to the support shaft 26 is set longer than a length L2 of the arm sections of the operating lever members 76A and 76B. Accordingly, the operating force is further reduced as compared to the case of using the operating lever members 76A and 76B.

As shown in FIG. 23, lug sections 82N with which lug sections of the latch member 70 are selectively engaged are formed at a predetermined interval on the connecting portion of the operating lever member 82.

A hook member 30' including a pair of lug sections formed at a predetermined interval on one end thereof is rotational movably provided at a tip end of the pressing member support body 14'. A coil spring (not shown) configured to bias the lug sections of the hook member 30' in a direction to be engaged with a pair of lug sections 11Nb (see FIG. 24) on the socket body 11 is arranged between the other end of the hook member 30' and a concave portion of the pressing member support body 14'.

Figure 25A:
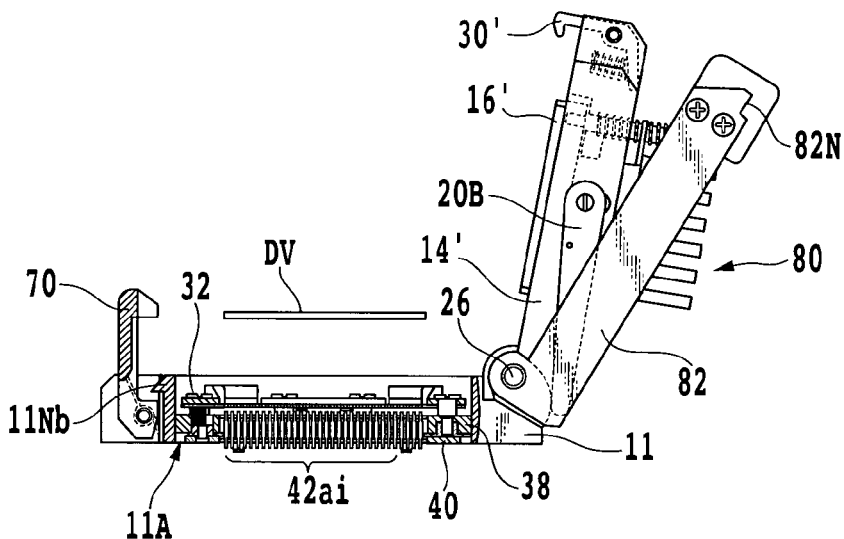
FIGS. 25A to 25D are views made available for explaining operations in the example illustrated in FIG. 22.

Moreover, torsion coil springs 28 are wound around two positions at portions of the support shaft 26 exposed at the base end section of the pressing member support body 14'. Accordingly, when the hook member 30' constituting part of the lock-unlock mechanism is in an unlocked state, the pressing member support body 14' is biased to a predetermined standby position by the biasing forces of the torsion coil springs 28 as shown in FIG. 25A.

Figure 24:
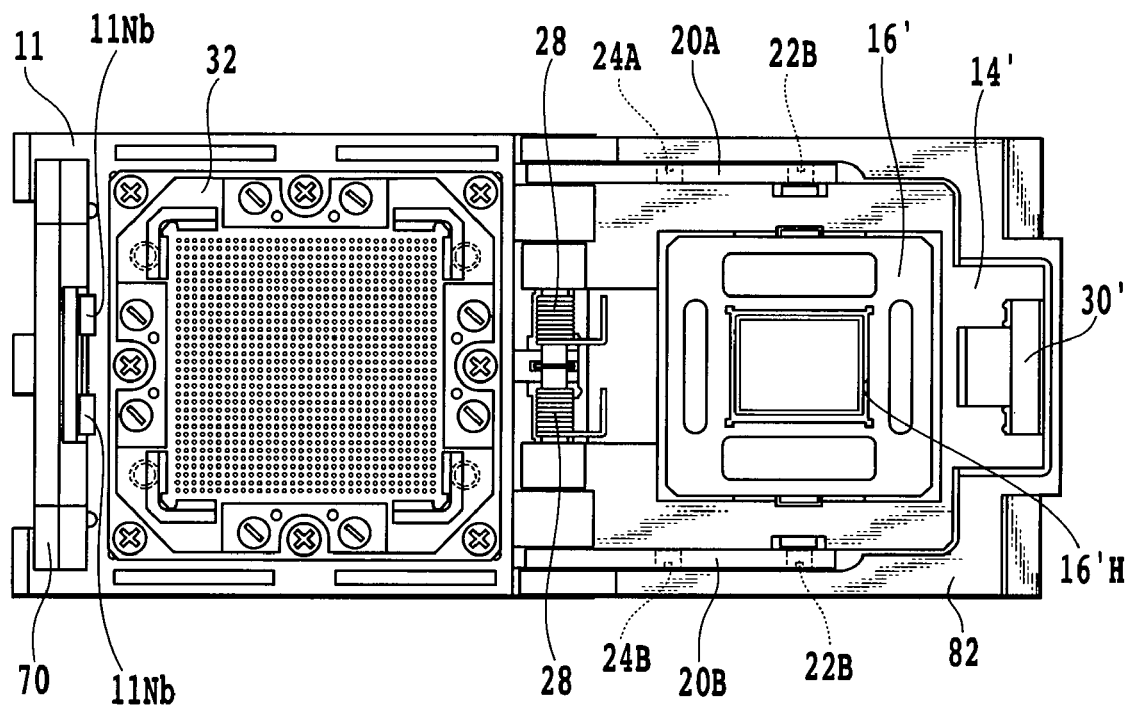
FIG. 24 is a plan view showing a state where the inside of the socket body in the example illustrated in FIG. 22 is exposed.

As shown in FIG. 24, the pressing member 16' includes, at its center, an opening 16'H which is configured to attach a heat sink. In this way, a heat transfer surface section of a heat sink 80 configured to touch on a surface of a package of a semiconductor device DV for radiation is exposed on an inner surface side of the pressing member 16'. As shown in FIG. 22, the heat sink 80 is fixed to an outer surface of the pressing member 16'.

The lock-unlock mechanism includes the latch member 70 made of metal, the lug sections 82N of the operating lever member 82, the hook member 30' of the pressing member support body 14', and the lug sections 11Nb of the socket body 11.

The latch member 70 includes lug sections 70Nb which are rotational movably supported on the socket body 11 by using the support shaft 11S and formed along a short side of the socket body 11 with a predetermined interval. Convex sections on the connecting portion of the operating lever member 82 are inserted into the lug sections 70Nb when the operating lever member 82 is locked with respect to the socket body 11. Moreover, the latch member 70 is biased in a direction to be engaged with the lug sections 82N of the operating lever member 82 by use of a torsion coil spring.

Figure 25B:
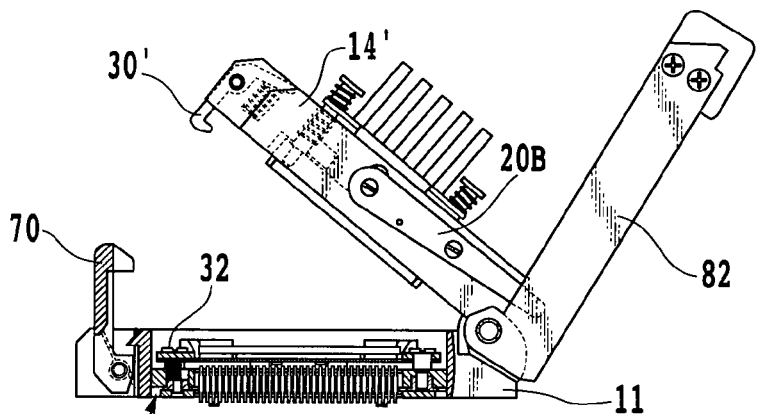
Figure 25C:
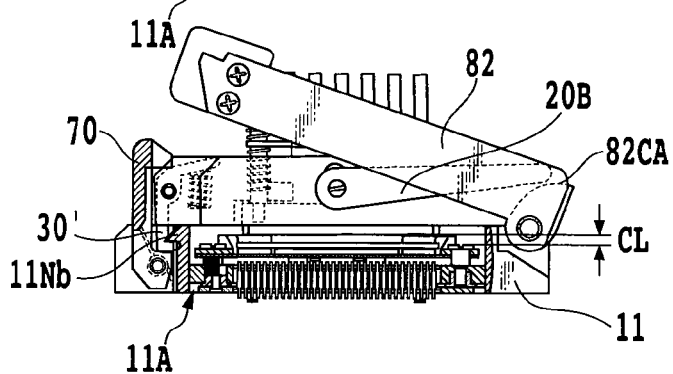
Figure 25D:
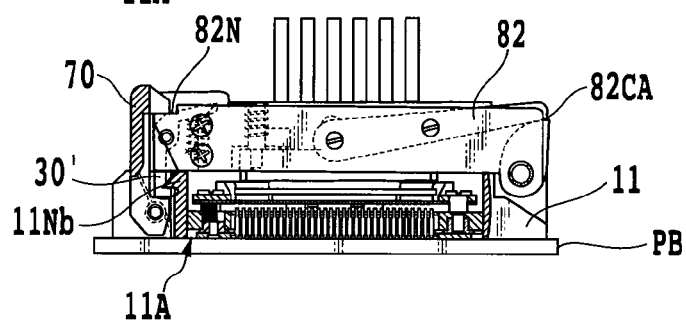

In the above-described configuration of the lock-unlock mechanism, when the pressing member support body 14' is locked with respect to the socket body 11 as shown in FIG. 25C, the pressing member support body 14' is rotated toward the above-described positioning section 32 as shown in FIG. 25B, and then a lower end surface thereof is caused to touch on an upper end surface of the socket body 11 while the lug sections of the hook member 30' are engaged with the lug sections 11Nb. Hence the pressing member support body 14' is set to the locked state. Then, as shown in FIG. 25C, the operating lever 82 is rotated and the latch member 70 is rotated counterclockwise. Thereafter, the latch member is restituted to the state shown in FIG. 25B by way of the biasing force of the torsion coil spring. Accordingly, the pair of lug sections 70Nb is locked with respect to the lug sections 82N as shown in FIGS. 22 and 25D and the operating lever member 82 is thereby set to the locked state.

In addition, when unlocking the operating lever member 82 and the pressing member support body 14' with respect to the socket body 11, the latch member 70 is rotated counterclockwise while the hook member 30' is rotated clockwise. In this way, the pressing member support body 14' is rotated back to the initial position by way of the resilience of the torsion coil springs 28.

Further, in order to fit the semiconductor device DV onto the positioning member 32 of the socket body 11, the semiconductor device DV is firstly fitted into the semiconductor device housing section 32A of the positioning member 32 in a state shown in FIG. 25A, and then the pressing member support body 14' is locked with respect to the socket body 11 as shown in FIG. 25C. Here, a predetermined clearance CL is defined between the pressing surface of the pressing member 16' and an upper surface of a package of the semiconductor device DV. Moreover, the pressing surface of the pressing member 16' and the upper surface of the package of the semiconductor device DV are set substantially parallel to each other.

Therefore, the operating force required to be applied to the pressing member support body 14' to turn the hook member 30' into the locked state is relatively small because it is only necessary to rotate the pressing member support body 14' against the biasing forces of the torsion coil springs 28.

Next, the operating lever member 82 is rotated around the support shaft 26 toward the pressing member support body 14' which is set to the locked state. Here, the cam surfaces of the cam sections 82CA are rotated around the support shaft 26. Accordingly, the engaging ends on the ends of the lever members 20A and 20B are respectively rotated upward around the supporting pins 24A and 24B. In this way, the pressing surface of the pressing member 16' is moved down against the biasing forces of the coil springs and touches on and presses the upper surface of the package of the semiconductor device at a predetermined pressure. Here, the pressing surface of the pressing member 16' touches on the upper surface of the package of the semiconductor device substantially in parallel thereto. Accordingly, the uniform pressure is applied to the upper surface of the package of the semiconductor device.

In addition, in order to take the semiconductor device DV out of the positioning member 32 of the socket body 11, the latch member 70 is rotated counterclockwise while the hook member 30' is rotated clockwise as described previously. In this way, the pressing member support body 14' is rotated back to the initial position by way of the resilience of the torsion coil springs 28. Thereafter, the semiconductor device DV can be taken out of the positioning member 32 of the socket body 11.

Figure 26:
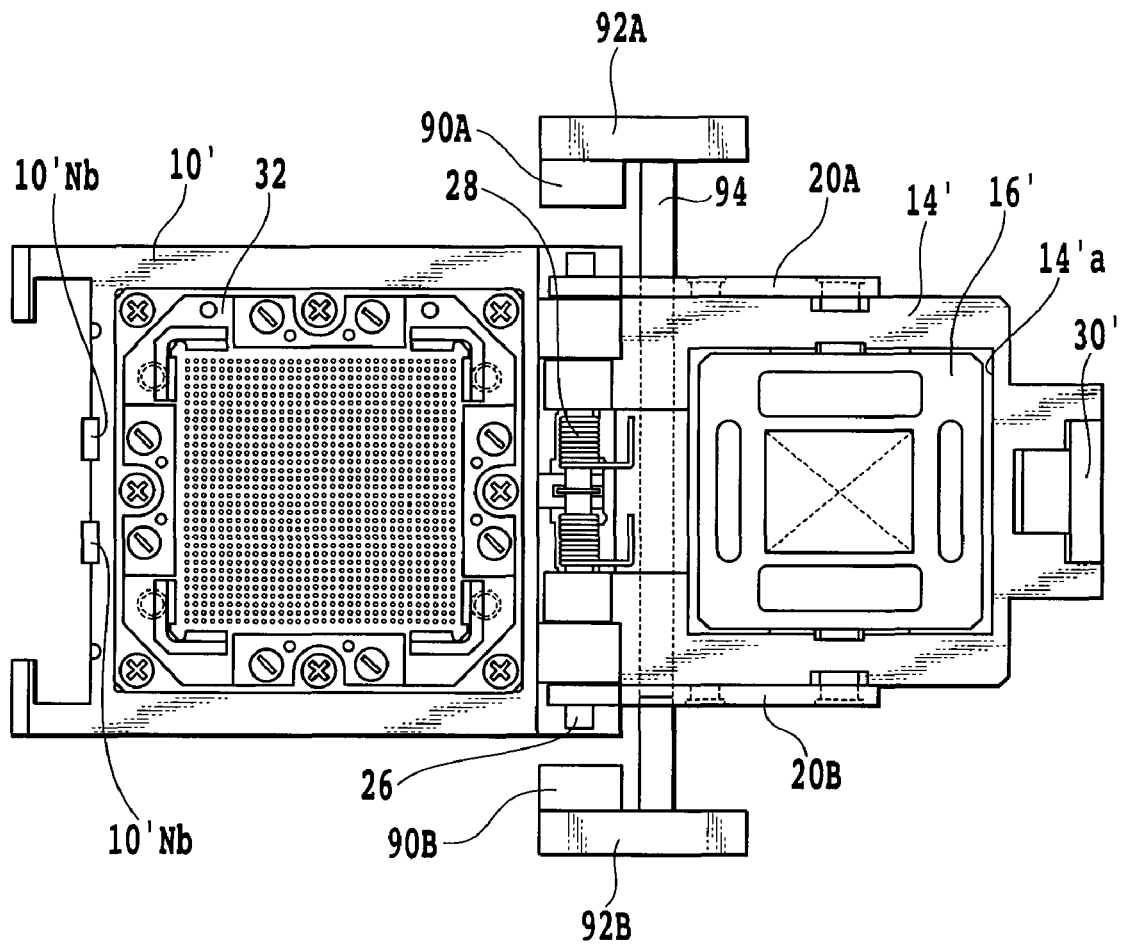
FIG. 26 is a plan view showing an appearance of a semiconductor device socket according to a fifth embodiment of the present invention.

FIG. 26 shows an appearance of a semiconductor device socket according to a fifth embodiment of the present invention.

In the example shown in FIG. 18, the operating lever members 76A and 76B are rotational movably supported by the socket body 10'. Instead, in the example shown in FIG. 26, respective operating lever members 92A and 92B are rotational movably supported by support tables 90A and 90B which are disposed on a printed circuit board PB.

Figure 27:
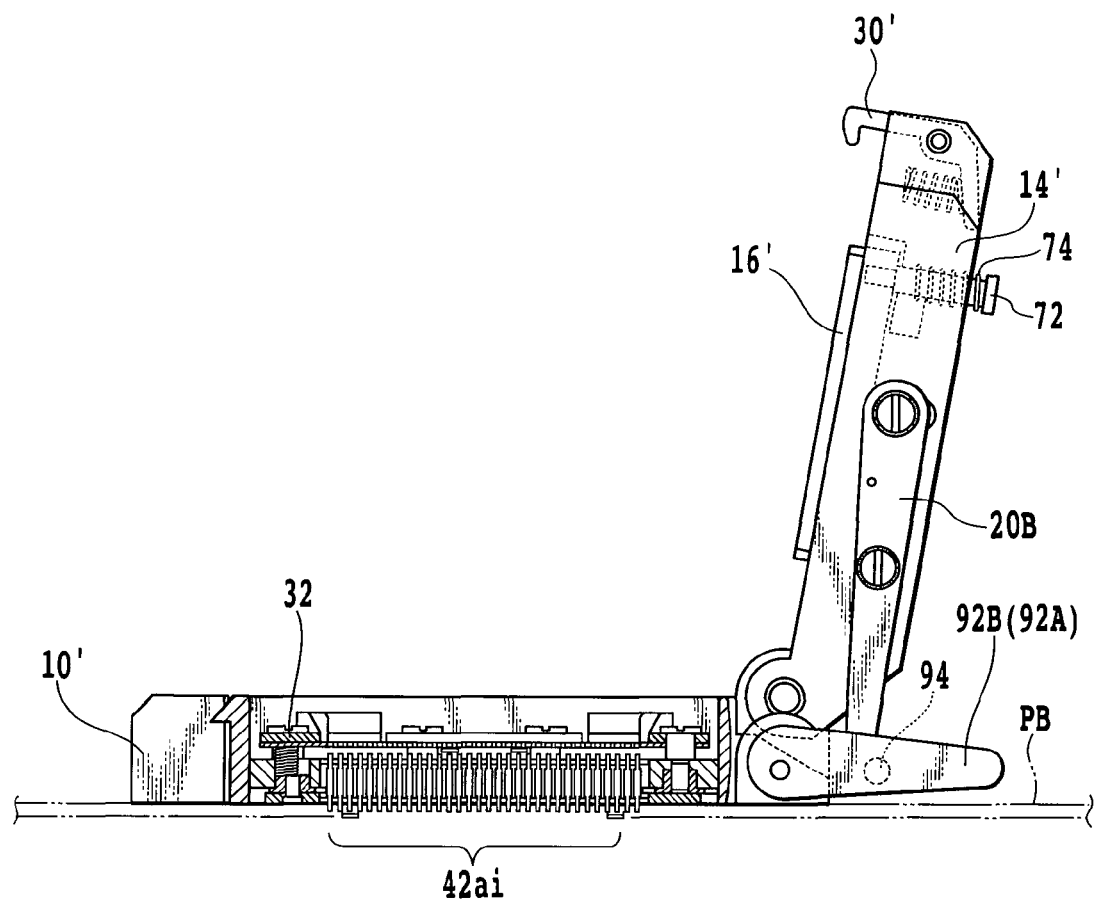
FIG. 27 is a side view of the example shown in FIG. 26.
Figure 28A:
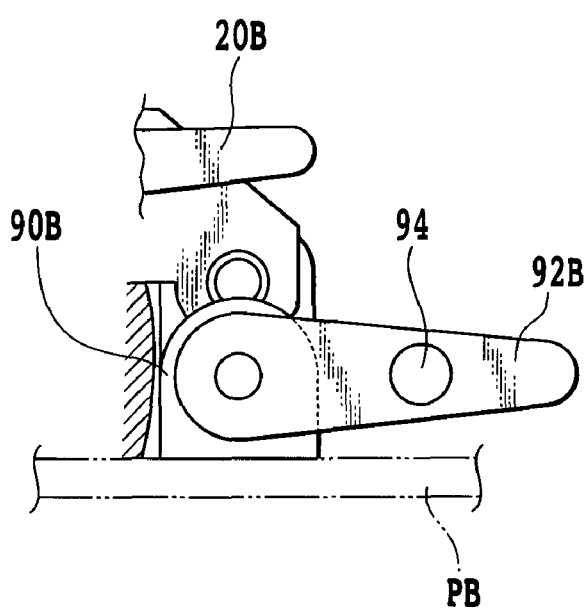
FIGS. 28A and 28B are views made available for explaining operations in the example illustrated in FIG. 26.
Figure 28B:
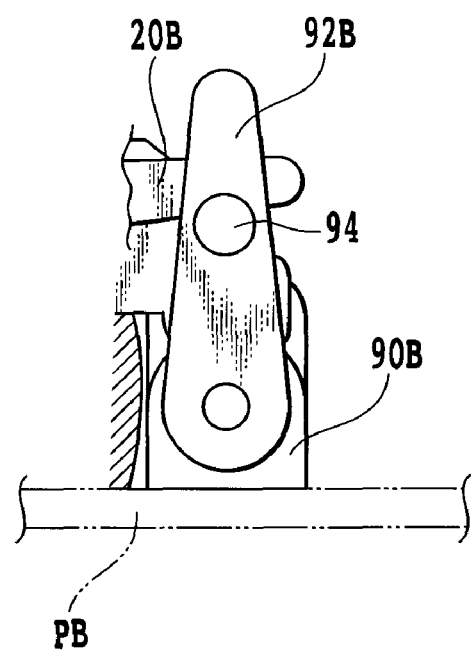

Here, in FIGS. 27, 28A, and 28B, the same constituents as those appearing in the example shown in FIG. 18 will be designated by the same reference numerals and duplicate explanation will be omitted.

Each of the support tables 90A and 90B is disposed to face a support shaft 26 in such a manner that each of center axis lines of the support tables 90A and 90B are located on a center axis line common to a center axis line of the support shaft 26 on the socket body 10'.

Ends of the operating members 92A and 92B are connected to each other by using an engaging pin 94. In addition, other ends of the operating members 92A and 92B are rotational movably supported by the support tables 90A and 90B, respectively.

In this configuration, in order to fit a semiconductor device DV onto a positioning member 32 of the socket body 10', the semiconductor device DV is firstly fitted into a semiconductor device housing section 32A of the positioning member 32 in a state shown in FIG. 27, and then a pressing member support body 14' is locked with respect to the socket body 10'. Here, a predetermined clearance is defined between a pressing surface of a pressing member 16' and an upper surface of a package of the semiconductor device DV. Moreover, the pressing surface of the pressing member 16' and the upper surface of the package of the semiconductor device DV are set substantially parallel to each other.

Therefore, an operating force required to be applied to the pressing member support body 14' is relatively small because it is only necessary to rotate the pressing member support body 14' against biasing forces of torsion coil springs 28.

Next, the operating lever members 92A and 92B are rotated from a state of being substantially parallel to a surface of a printed circuit board PB as shown in FIG. 28A, to a state of being substantially perpendicular to the surface of the printed circuit board PB as shown in FIG. 28B. Here, the engaging pin 94 is rotated so as to slide on engaging ends on ends of lever members 20A and 20B. Accordingly, the engaging ends on the ends of the lever members 20A and 20B are respectively rotated upward around supporting pins 24A and 24B. In this way, the pressing surface of the pressing member 16' is moved down against biasing forces of coil springs and touches on and presses the upper surface of the package of the semiconductor device at a predetermined pressure. Here, the pressing surface of the pressing member touches on the upper surface of the package of the semiconductor device substantially in parallel thereto. Accordingly, the uniform pressure is applied to the upper surface of the package of the semiconductor device.

In addition, in order to take the semiconductor device DV out of the positioning member 32 of the socket body 10', lug sections of a hook member 30' are disengaged from lug sections 10'Nb of the socket body 10'. Moreover, the operating lever members 92A and 92B are rotated backed to the initial state as shown in FIG. 28A. Then, the pressing member support body 14' is rotated by way of the resilience of the torsion coil springs 28. Thereafter, the semiconductor device DV can be taken out of the positioning member 32 of the socket body 10'.

Figure 29:
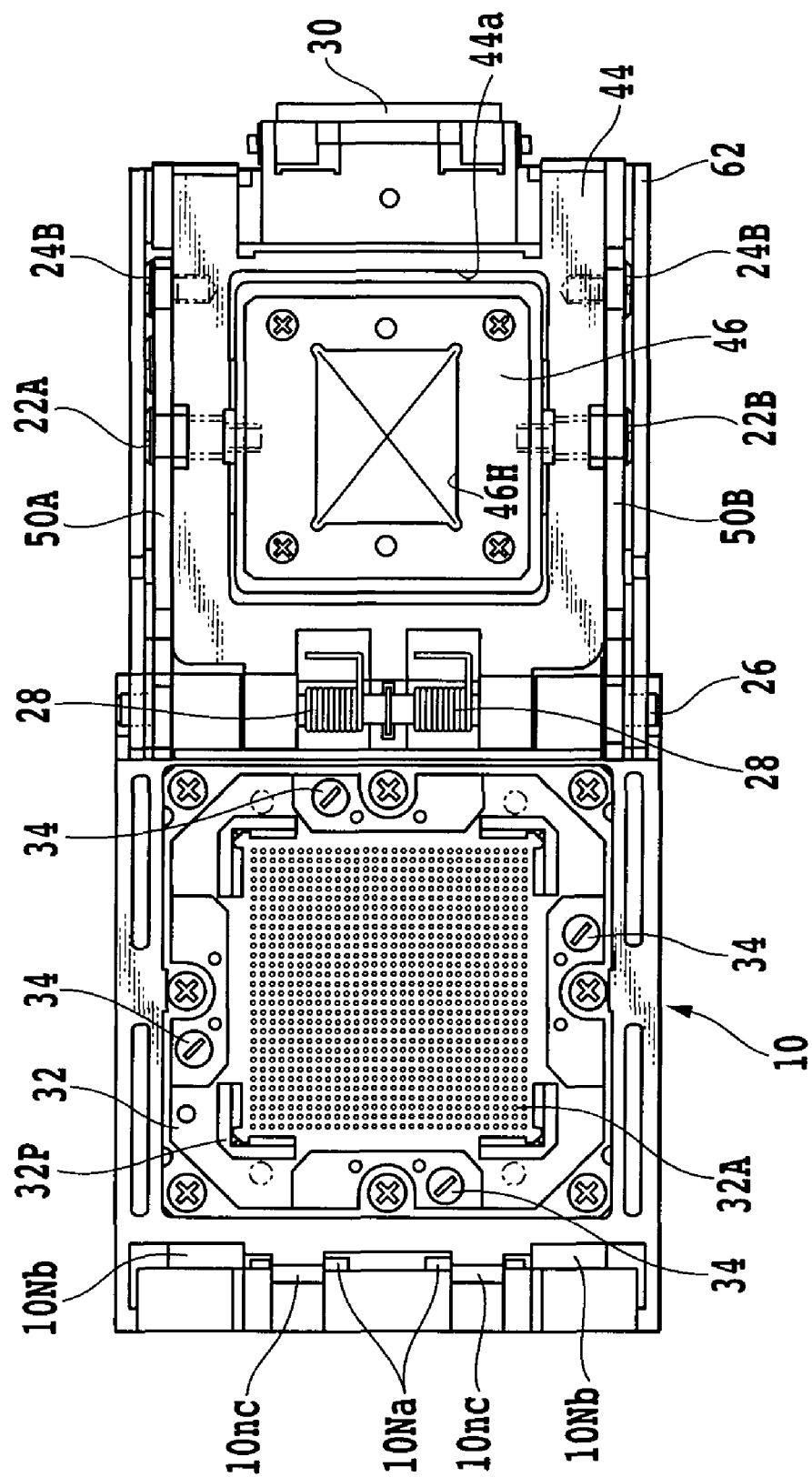
FIG. 29 is a plan view showing an appearance of a semiconductor device socket according to a sixth embodiment of the present invention.

FIG. 29 shows an appearance of a semiconductor device socket according to a sixth embodiment of the present invention.

In the example shown in FIGS. 1 to 6, the pressing surface of the pressing member 16 is moved down against the biasing forces of the coil springs as the ends of the lever members 20A and 20B are rotated upward due to rotation of the engaging pin 18 around the support shaft 26. Instead, in the example shown in FIG. 29, a pressing surface of a pressing member 46 is moved down against biasing forces of coil springs as ends of lever members 50A and 50B are rotated downward due to rotation of an engaging pin 62PA around a support shaft 26.

Here, in FIGS. 29 to 33, the same constituents as those appearing in the example shown in FIG. 6 will be designated by the same reference numerals and duplicate explanation will be omitted.

In FIG. 29, the semiconductor device socket comprises: a socket body 10 having, at its center, a housing section 10A for housing a positioning member 32 and a contact pin module; a pressing member support body 44 having one end rotational movably supported by the socket body 10 and being configured to support a pressing member to be described later so as to be movable inward; an operating lever member 62 having one end rotational movably supported by the socket body 10 and being configured to operate lever members 50A and 50B that are rotational movably supported by the pressing member support body 44; and a lock-unlock mechanism configured to lock or unlock the pressing member support body 44 and the operating lever member 62 to the socket body 10.

Figure 32:
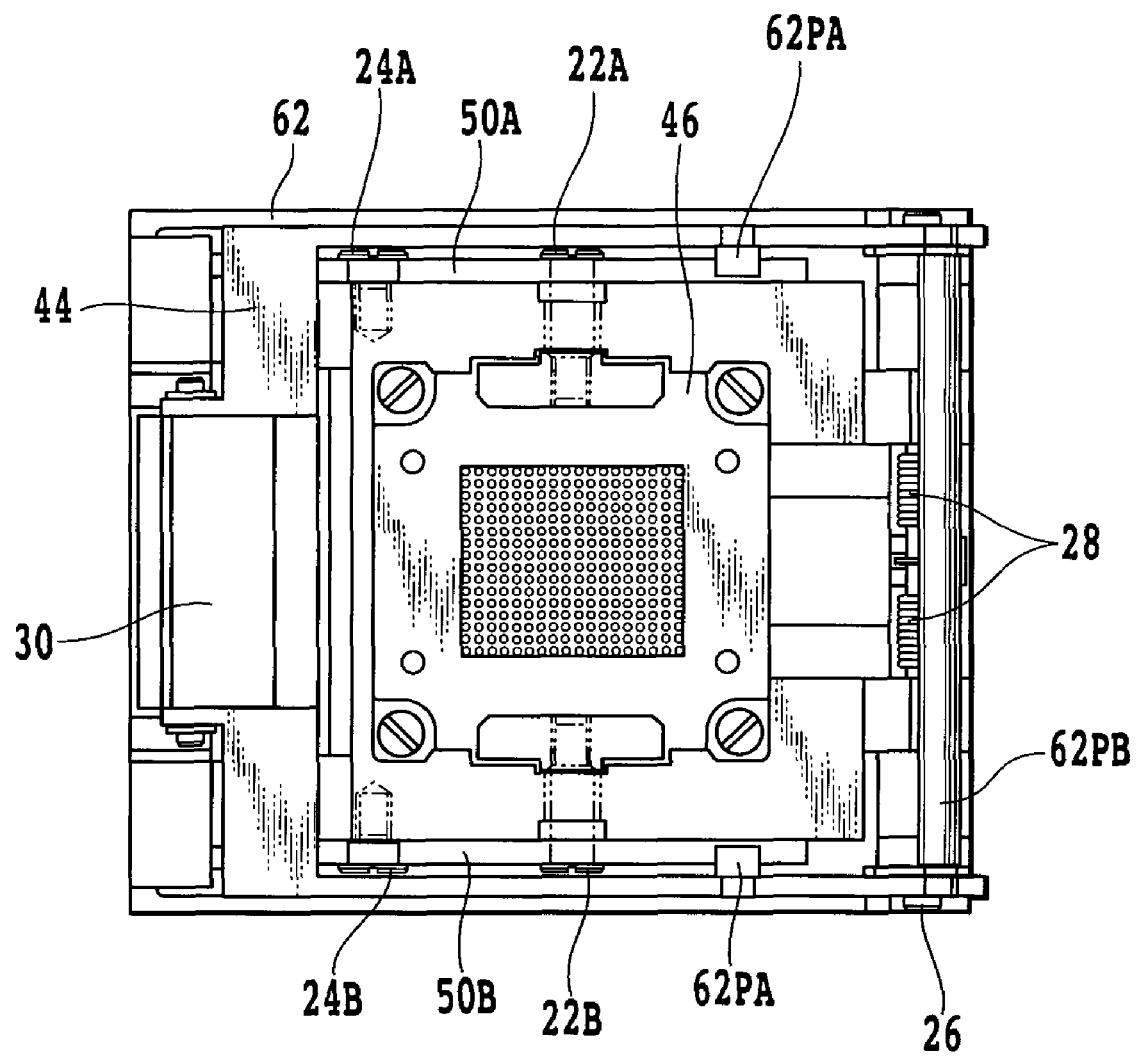
FIG. 32 is a plan view made available for explaining the operation in the example illustrated in FIG. 29.
Figure 33:
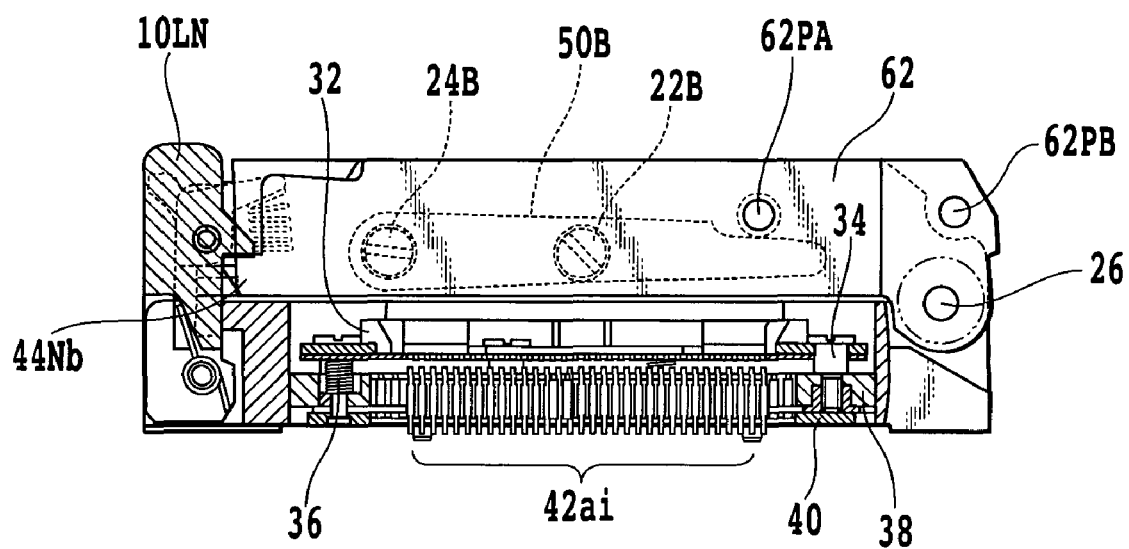
FIG. 33 is a side view showing a state illustrated in FIG. 32, including a partial cross-sectional view thereof.

FIGS. 32 and 33 show a state where the pressing member support body 44 and the operating lever member 62 are locked with respect to the socket body 10.

Figure 30:
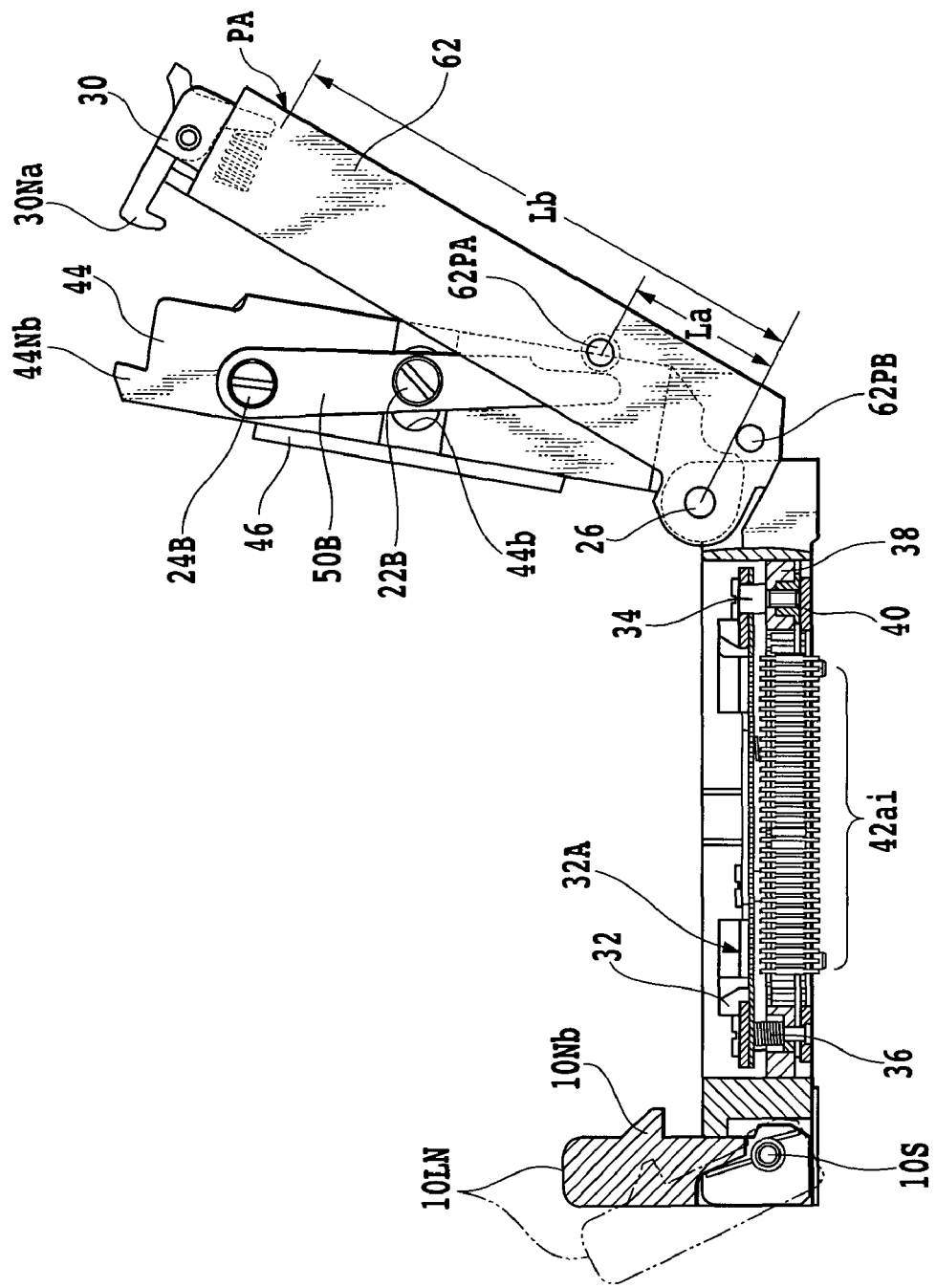
FIG. 30 is a side view of the example illustrated in FIG. 29.

As shown in FIG. 30, base end portions of the pressing member support body 44 and of the operating lever member 62 are rotational movably supported on one of short sides of the socket body 10 by use of the support shaft 26. The support shaft 26 penetrates into one end side of the periphery of the housing section 10A in the center. In addition, a base end section of a latch member 10LN constituting part of the lock-unlock mechanism to be described later is rotational movably supported on the other short side of the socket body 10 by use of a support shaft 10S. The support shaft 10S penetrates into the other end side of the periphery of the housing section 10A in the center.

As shown in FIGS. 29 and 30, the operating lever member 62 comprises arm sections that extend along side walls constituting long edge sides at an outer shell section of the housing section 10A of the socket body 10, a connecting portion configured to connect ends of the arm sections opposed to each other, a stopper pin 62PB arranged across other ends of the pair of the arm sections, and engaging pins 62PA provided on inner sides of the arm sections so as to face each other and to protrude inward.

Holes into which both ends of the support shaft 26 penetrate are formed on the other ends of the arm sections of the operating lever member 62 in positions adjacent to the stopper pin 62PB. The support shaft 26 penetrates into a through hole at an end of the socket body 10, the base end section of the pressing member support body 44, and the above-described holes of the operating lever member 62. In this way, the operating lever member 62 and the pressing member support body 44 are rotational movably supported. Engaging ends formed on ends of the lever members 50A and 50B to be described later are slidably touched with the engaging pins 62PA.

As shown in FIG. 30, a distance Lb along the arm section from a region PA of the arm section of the operating lever member 62 which is a point of application of an operating force to the support shaft 26 is set longer than a mutual distance La between the engaging pin 62PA and the support shaft 26. In this way, the engaging ends on the ends of the lever members 50A and 50B to be described later are rendered easily swingable around supporting pins 24A and 24B upon application of a relatively small operating force to the regions PA on the arm sections of the operating lever member 62.

In addition, a hook member 30 having a pair of lug sections 30Na formed at a predetermined interval on one end of the hook member 30 is rotational movably connected to the connecting portion at the arm sections of the operating lever member 62.

Moreover, torsion coil springs 28 are wound around two positions at portions of the support shaft 26 exposed at the base end section of the pressing member support body 44. The torsion coil springs 28 are configured to bias the pressing member support body 44 in a direction away from the socket body 10. Accordingly, when the latch member 10LN constituting part of the lock-unlock mechanism is in an unlocked state, the operating lever member 62 and the pressing member support body 44 are biased to predetermined standby positions by the biasing forces of the torsion coil springs 28 as shown in FIG. 30.

As shown in FIG. 29, the pressing member support body 44 has, at its center, an opening 44a which is configured to movably house a pressing member 46 therein. The pressing member 46 has a pressing surface formed at a lower end section thereof which is configured to press a surface of the semiconductor device. A pair of leg sections (not shown) of the pressing member 46, which is guided to an inner peripheral surface of the opening 44a, are connected to the lever members 50A and 50B respectively through slots 44b by use of connecting pins 22A and 22B. As shown in FIG. 29, the pressing member 46 has, at its center, a attaching opening 46H which is configured to attach an unillustrated heat sink.

Each of the slots 44b of the pressing member support body 44 extends almost vertically with respect to an upper end surface and a lower end surface of the pressing member support body 44. The pressing member 46 is biased in a direction to approach the pressing member support body 44, i.e. in a direction to cause the pressing surface thereof to be away from the socket body 10, by way of coil springs (not shown) respectively wound around machine screws Bs that are provided in four positions on the periphery of the opening 44a. In this way, the pressing member 46 is allowed to move along the slots 44b in conjunction with movements of the lever members 50A and 50B. Accordingly, the pressing surface of the pressing member 46 is allowed to move substantially in parallel to the upper end surface and the lower end surface of the pressing member support body 44 without causing an undesirable tilt.

The lever members 50A and 50B are rotational movably supported by the pressing member support body 44 by way of supporting pins 24A and 24B which are respectively inserted into holes provided ends thereof. Regarding the lever member 50A, a mutual distance between the connecting pin 22A and the supporting pin 24A is set shorter than a distance between a center axis line of the supporting pin 24A and an engaging end on one end of the lever member 50A. Regarding the lever member 50B, a mutual distance between the connecting pin 22B and the supporting pin 24B is set shorter than a distance between a center axis line of the supporting pin 24B and an engaging end on one end of the lever member 50B.

Therefore, it is possible to reduce a force to act the engaging ends on the ends of the lever members 50A and 50B by way of the principle of leverage.

A pair of lug sections 44Nb is formed with a predetermined interval at a tip end close to the above-described latch member 10LN of the pressing member support body 44. The pair of lug sections 44Nb is respectively engaged with a pair of lug sections 10Nb provided on the latch member 10LN.

The lock-unlock mechanism comprises the latch member 10LN made of metal, the pair of lug sections 44Nb on the pressing member support body 44, and the above-described hook member 30 of the operating lever member 62.

Figure 31:
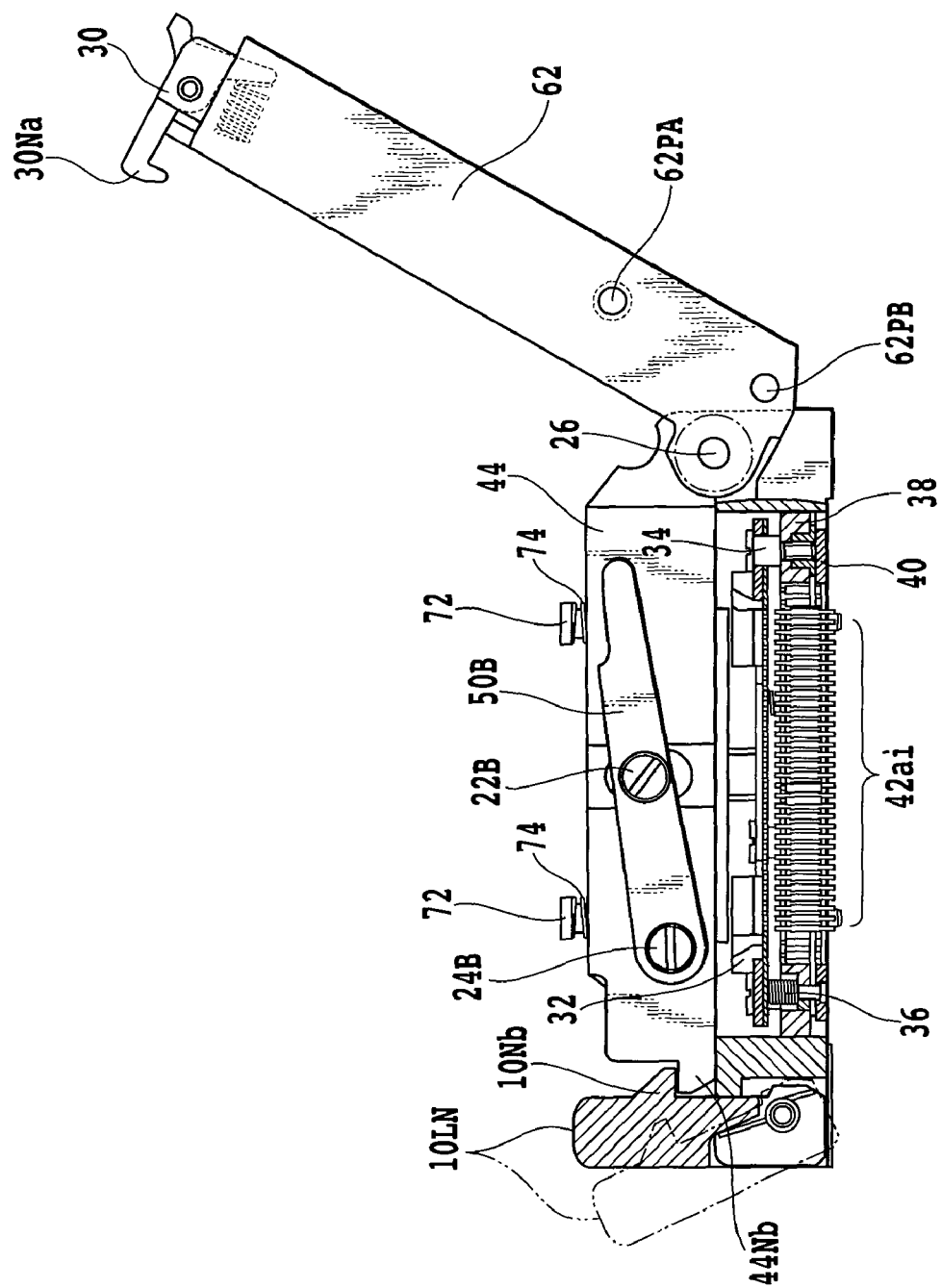
FIG. 31 is another side view made available for explaining an operation in the example illustrated in FIG. 29.

In the above-described configuration of the lock-unlock mechanism, when the pressing member support body 44 is locked with respect to the socket body 10, with the latch member 10LN rotated counterclockwise to the standby position as indicated by a chain double-dashed line in FIG. 30 and after the pressing member support body 44 is rotated toward the above-described positioning member 32 in that state, then, lower end surfaces of the pair of the lug sections 44Nb touch on an upper end surface of the socket body 10. Thereafter, by rotating the latch member 10LN clockwise, the pair of lug sections 44Nb is fixed by the lug sections 10Nb as shown in FIG. 31, thereby turning the pressing member support body 44 into the locked state. Subsequently, when the operating lever member 62 is locked with respect to the socket body 10, the operating lever member 62 is rotated toward the pressing member support member 44 which is set to the locked state, and then the lug sections 30Na of the hook member 30 are locked by lug sections 10nc on the socket body 10, thereby turning the operating lever member 62 into the locked state with respect to the socket body 10.

On the other hand, when the operating lever member 62 and the pressing member support body 44 are unlocked from the socket body 10, the latch member 10LN is rotated counterclockwise to the standby position. In this way, protrusions 10Na of the latch member 10LN kick up peripheral parts of the lug sections 30Na of the hook member 30 so as to be disengaged from the lug sections 10nc. At the same time, the operating lever member 62 and the pressing member support body 44 are rotated back to initial positions almost simultaneously as shown in FIG. 30 by way of the resilience of the torsion coil springs 28.

Further, in order to fit a semiconductor device DV onto the positioning member 32 of the socket body 10, the semiconductor device DV is firstly fitted into a semiconductor device housing section 32A of the positioning member 32, and then the pressing member support body 44 is locked with respect to the socket body 10. Here, a predetermined clearance is defined between the pressing surface of the pressing member 46 and an upper surface of a package of the semiconductor device DV. Moreover, the pressing surface of the pressing member 16 and the upper surface of the package of the semiconductor device DV are set substantially parallel to each other.

Therefore, the operating force required to be applied to the pressing member support body 44 to turn the latch member 10LN into the locked state is relatively small because it is only necessary to rotate the pressing member support body 44 against the biasing forces of the torsion coil springs 28.

Next, the operating lever member 62 is rotated around the support shaft 26 toward the pressing member support body 44 which is set to the locked state. At that time, the engaging pins 62PA are rotated around the support shaft 26. Accordingly, the engaging ends on the ends of the lever members 50A and 50B are respectively rotated downward around the supporting pins 24A and 24B. In this way, the pressing surface of the pressing member 46 is moved down against the biasing forces of the coil springs and touches on the upper surface of the package of the semiconductor device and presses the upper surface at a predetermined pressure. At that time, as shown in FIG. 33, because the pressing surface of the pressing member 46 touches on the upper surface of the package of the semiconductor device substantially in parallel thereto, therefore, the uniform pressure is applied to the upper surface of the package of the semiconductor device.

In addition, in order to take the semiconductor device DV out of the positioning member 32 of the socket body 10, the latch member 10LN is rotated counterclockwise to the standby position as described previously. In this way, the protrusions 10Na on the latch member 10LN kick up the peripheral parts of the lug sections 30Na of the hook member 30 so as to be disengaged from the lug sections 10nc. At the same time, the operating lever member 62 and the pressing member support body 44 are rotated almost simultaneously to return to the initial positions by way of the resilience of the torsion coil springs 28. Thereafter, the semiconductor device DV can be taken out of the positioning member 32 of the socket body 10.

Therefore, it is possible to turn the operating lever member 62 and the pressing member support body 44 into the unlocked state by only in a single step using the latch member 10LN.

In the example shown in FIGS. 29 and 30, regarding the lever member 50A, the mutual distance between the connecting pin 22A and the supporting pin 24A is set shorter than the distance between the center axis line of the supporting pin 24A and the engaging end on one end of the lever member 50A. In addition, regarding the lever member 50B, the mutual distance between the connecting pin 22B and the supporting pin 24B is set shorter than the distance between the center axis line of the supporting pin 24B and the engaging end on one end of the lever member 50B.

Figure 34:
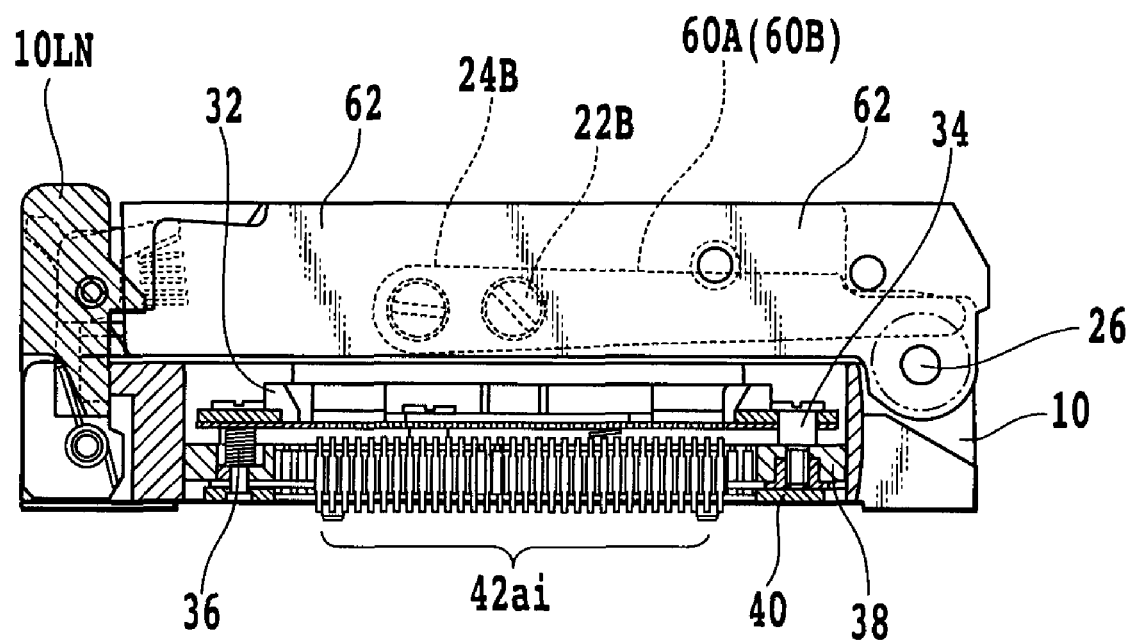
FIG. 34 is a side view showing another example of a lever member used in the example illustrated in FIG. 29, including a partial cross-sectional view thereof.

However, the present invention is not limited only to this configuration. Instead of applying the lever members 50A and 50B, it may be provided with lever members 60A and 60B as shown in FIG. 34, which have longer total lengths than total lengths of the lever members 50A and 50B, for example. In this case, a mutual distance between the connecting pin 22A and the supporting pin 24A in the lever members 60A and 60B is set shorter than the case of the lever members 50A and 50B. Moreover, the distance from the supporting pins 24A and 24B to the engaging ends is set longer.

Therefore, it is possible to further reduce the force to be applied to the engaging ends on the ends of the lever members 60A and 60B as compared to the case of the lever members 50A and 50B by way of the principle of leverage.

Figure 35A:
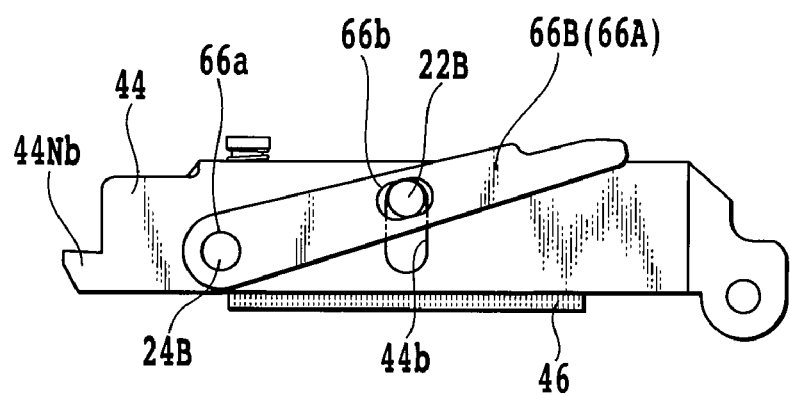
FIGS. 35A and 35B are views schematically showing still another example of the lever member used in the example illustrated in FIG. 29.

Additionally, in the example shown in FIGS. 29 and 30, the connecting pins 22A and 22B as well as the supporting pins 24A and 24B are configured to penetrate with predetermined clearances into circular holes formed on the lever members 50A and 50B. However, this example according to the present invention is not limited only to this configuration. For example, as shown in FIG. 35A, in lever members 66A and 66B, the connecting pins 22A and 22B may penetrate with predetermined clearances into slots 66b that extend in a longitudinal direction thereof. Slots 66b are formed near the center position of each of the lever members 66A and 66B. Circular holes 66a formed at one end of the lever members 66A and 66B, respectively are connected to an end of the supporting pins 24A and 24B with predetermined clearances.

Figure 35B:
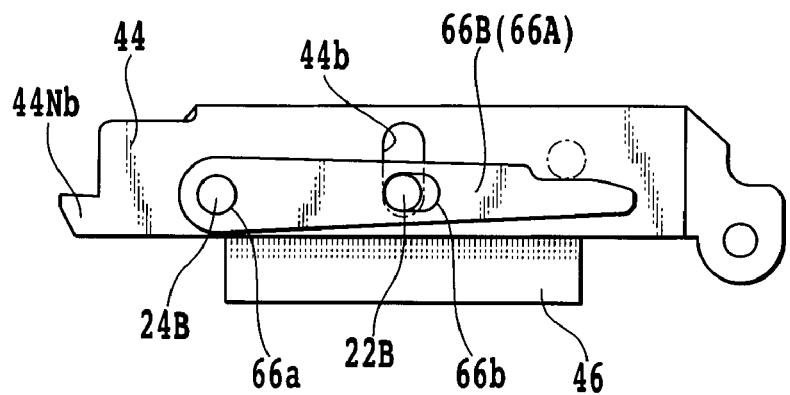

Accordingly, when the pressing surface of the pressing member 46 presses a semiconductor device as shown in FIG. 35B, the pressing member 46 is allowed to be moved up and down smoothly and to be guided by the slots 44b with peripheral portions of the connecting pins 22A and 22B touching and sliding to the slots 66b.

Figure 36A:
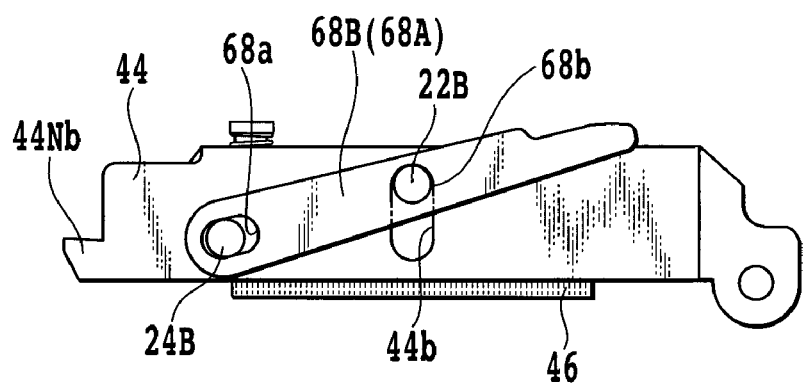
FIGS. 36A and 36B are views schematically showing yet another example of the lever member used in the example illustrated in FIG. 29.

Furthermore, as shown in FIG. 36A, for example, in lever members 68A and 68B, the supporting pins 24A and 24B may penetrate with predetermined clearances into slots 68a that extend in a longitudinal direction thereof. Slots 68a are formed at one end of each of the lever members 68A and 68B. Circular holes 68b formed near the center position of each of the lever members 68A and 68B, respectively are connected to an end of the connecting pins 22A and 22B with predetermined clearances.

Figure 36B:
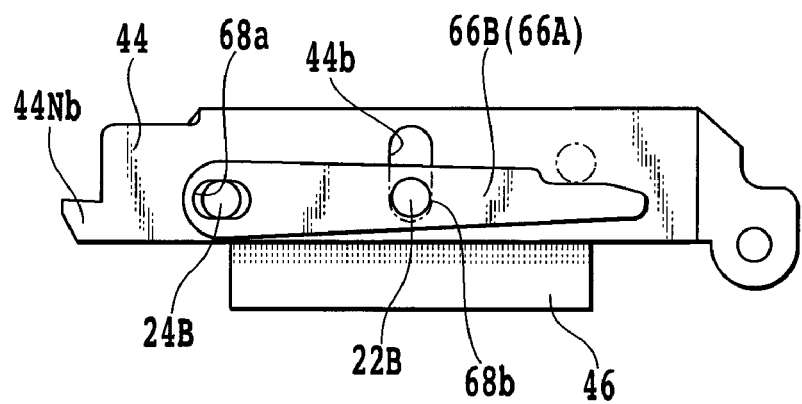

Accordingly, when the pressing surface of the pressing member 46 presses a semiconductor device as shown in FIG. 36B, the pressing member 46 is allowed to be moved up and down smoothly and to be guided by the slots 44b with peripheral portions of the supporting pins 24A and 24B touching and sliding to the slots 68a.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor device socket comprising:
    a socket body having a semiconductor device mounting section on which a semiconductor device is detachably arranged and a contact terminal having a contact section to be electrically connected to a terminal of the semiconductor device arranged on the semiconductor device mounting section;
    a pressing member having a pressing surface configured to press the terminal of the semiconductor device against the contact section of the contact terminal or to release the terminal of the semiconductor device from a pressed state;
    a pressing member support body having one end rotational movably supported by the socket body and being configured to movably support the pressing surface of the pressing member while keeping the pressing surface substantially parallel to a surface to be pressed of the semiconductor device;
    a lever member having an intermediate section rotational movably supported by said pressing member support body, having one end connected to said pressing member, and being configured to move said pressing member with respect to said pressing member support body; and
    a lever member driving means configured to swing the other end of said lever member.

2. The semiconductor device socket according to claim 1, wherein said lever member driving means is an operating lever arranged on said socket body and rotational movably supported by a support shaft in common with a support shaft supporting said pressing member support body.

3. The semiconductor device socket according to claim 2, wherein the operating lever has an engaging pin configured to engage with the other end of said lever member.

4. The semiconductor device socket according to claim 2, wherein the operating lever has a cam section configured to engage with the other end of said lever member.

5. The semiconductor device socket according to claim 1, wherein the contact terminal comprises:
a sleeve having the contact section formed by press work;
a plunger having, at its one end, a large-diameter section to be inserted into the sleeve, and, at its other end, a contact section to be in contact with an electrode section of a printed board; and
a coil spring wound around the plunger and configured to bias the plunger in a direction away from the sleeve.

6. The semiconductor device socket according to claim 5, wherein the sleeve has, at its lower end, a protrusion configured to regulate a position of an end of the coil spring.

7. The semiconductor device socket according to claim 1 further comprising:
a lock-unlock mechanism provided on one end side of said socket body and configured to turn said pressing member support body and said lever member driving means into any of a locked state and unlocked state with respect to said socket body.

8. A semiconductor device socket comprising:
a socket body having a semiconductor device mounting section on which a semiconductor device is detachably arranged, and a contact terminal having a contact section to be electrically connected to a terminal of the semiconductor device arranged on the semiconductor device mounting section;
a pressing member having a pressing surface configured to press the terminal of the semiconductor device against the contact section of the contact terminal or to release the terminal of the semiconductor device from a pressed state;
a pressing member support body having one end rotational movably supported by said socket body and being configured to movably support the pressing surface of said pressing member while keeping the pressing surface substantially parallel to a surface to be pressed of the semiconductor device;
a lever member having an end rotational movably supported by said pressing member support body, having an intermediate section located between the one end and the other end and connected to said pressing member, and being configured to move said pressing member with respect to said pressing member support body; and
a lever member driving means configured to swing the other end of said lever member.

9. The semiconductor device socket according to claim 8, wherein said lever member driving means is an operating lever arranged on said socket body and rotational movably supported by a common support shaft supporting said pressing member support body.

10. The semiconductor device socket according to claim 9, wherein the operating lever includes an engaging pin configured to engage with the other end of said lever member.

11. The semiconductor device socket according to claim 8, wherein said pressing member support body has slots extending generally vertically with respect to an upper end surface and a lower end surface of said pressing member support body and said pressing member is connected to said lever members through slots by connecting pins.

12. The semiconductor device socket according to claim 11, wherein said lever member has a slot to be penetrated by the connecting pin with predetermined clearances.

13. The semiconductor device socket according to claim 11, wherein said lever member has a slot to be penetrated by a supporting pin with predetermined clearances.

* * * * *